US010936768B2

(12) United States Patent
Sengupta et al.

(10) Patent No.: US 10,936,768 B2
(45) Date of Patent: Mar. 2, 2021

(54) INTERFACE FOR VISUALIZING AND IMPROVING MODEL PERFORMANCE

(71) Applicant: Aible Inc., San Francisco, CA (US)

(72) Inventors: Arijit Sengupta, San Francisco, CA (US); Jonathan Wray, San Francisco, CA (US); Grigory Nudelman, San Francisco, CA (US); Daniel Kane, San Francisco, CA (US); Geoffrey Grant, San Francisco, CA (US)

(73) Assignee: Aible, Inc., San Francisco, CA (US)

( * ) Notice: Subject to any disclaimer, the term of this patent is extended or adjusted under 35 U.S.C. 154(b) by 0 days.

(21) Appl. No.: 16/290,446

(22) Filed: Mar. 1, 2019

(65) Prior Publication Data

US 2020/0117765 A1    Apr. 16, 2020

Related U.S. Application Data

(63) Continuation-in-part of application No. 16/169,208, filed on Oct. 24, 2018, now Pat. No. 10,586,164.
(Continued)

(51) Int. Cl.
*G06T 11/20* (2006.01)
*G06N 20/00* (2019.01)
(Continued)

(52) U.S. Cl.
CPC .............. *G06F 30/20* (2020.01); *G06N 7/005* (2013.01); *G06N 20/00* (2019.01); *G06T 11/206* (2013.01)

(58) Field of Classification Search
CPC ...... G06F 2111/10; G06F 30/20; G06F 17/18; G06N 20/00; G06N 20/20; G06K 9/6282; G06K 9/6218
See application file for complete search history.

(56) References Cited

U.S. PATENT DOCUMENTS 9,336,483 B1  5/2016  Abeysooriya et al.
10,586,164 B1  3/2020  Sengupta et al.
(Continued)

OTHER PUBLICATIONS

Drummond et al. (2000) "Explicitly Representing Expected Cost: An Alternative to ROC Representation", Proceedings of the sixth ACM SIGKDD international conference on Knowledge discovery and data mining, 10 pages.

*Primary Examiner* — Jin Cheng Wang
(74) *Attorney, Agent, or Firm* — Mintz, Levin, Cohn, Ferris, Glovsky and Popeo, P.C.

(57) ABSTRACT

Performance of a first generated model can be monitored while the first generated model is deployed for use on live data. The monitoring can include determining a first performance value of the first generated model. Performance of a second generated model can be monitored while the second generated model is deployed for use on live data. The monitoring can include determining a second performance value of the second generated model. A plot including a first axis and a second axis can be rendered. The first axis can include a characterization of a first performance metric and the second axis can include a characterization of a second performance metric. A first graphical object at a first location characterizing the first performance value and a second graphical object at a second location characterizing the second performance value can be rendered. Related apparatus, systems, techniques and articles are also described.

21 Claims, 37 Drawing Sheets

Related U.S. Application Data

(60) Provisional application No. 62/745,966, filed on Oct. 15, 2018.

(51) Int. Cl.
*G06F 30/20* (2020.01)
*G06N 7/00* (2006.01)

(56) References Cited

U.S. PATENT DOCUMENTS

| | | |
|---|---|---|
| 2005/0234697 A1 | 10/2005 | Pinto et al. |
| 2009/0299896 A1 | 12/2009 | Zhang et al. |
| 2010/0196941 A1* | 8/2010 | Braun ................ G01N 33/6893 435/23 |
| 2010/0205521 A1 | 8/2010 | Folting |
| 2013/0198569 A1 | 8/2013 | Eidelman |
| 2014/0315742 A1* | 10/2014 | Blakely .................... G01T 1/00 506/9 |
| 2016/0350673 A1 | 12/2016 | Kumar et al. |
| 2016/0371601 A1 | 12/2016 | Grove et al. |
| 2017/0004584 A1 | 1/2017 | Wang et al. |
| 2017/0368258 A1* | 12/2017 | Fleischer ........... A61B 5/04085 |
| 2018/0067118 A1* | 3/2018 | Kim ....................... G16B 25/00 |
| 2018/0080937 A1* | 3/2018 | Brenner ........... G01N 33/57419 |
| 2018/0277246 A1 | 9/2018 | Zhong et al. |
| 2018/0346151 A1* | 12/2018 | Sturlaugson ............. B64F 5/60 |
| 2019/0318266 A1* | 10/2019 | Kim .................... G06K 9/6218 |
| 2020/0117490 A1 | 4/2020 | Sengupta et al. |
| 2020/0118018 A1 | 4/2020 | Sengupta et al. |
| 2020/0118019 A1 | 4/2020 | Sengupta et al. |

* cited by examiner

INTERFACE FOR VISUALIZING AND IMPROVING MODEL PERFORMANCE

CROSS-REFERENCE TO RELATED APPLICATION

This application is a continuation-in-part of and claims priority under 35 U.S.C. § 120 to U.S. patent application Ser. No. 16/169,208 filed on Oct. 24, 2018, and granted as U.S. Pat. No. 10,586,164, entitled "Interface for Visualizing and Improving Model Performance", which claims priority under 35 U.S.C. § 119(e) to U.S. Patent Application No. 62/745,966 filed Oct. 15, 2018, the entire contents of each of which is hereby expressly incorporated by reference herein.

TECHNICAL FIELD

The subject matter described herein relates to an interface for visualizing and improving model performance.

BACKGROUND

In predictive analytics, accuracy may not be a reliable metric for characterizing performance of a predictive algorithm. This is because accuracy can yield misleading results, particularly to a non-expert business user and particularly where the data set is unbalanced or cost of error of false negatives and false positives is mismatched. An unbalanced dataset can be one in which the numbers of observations in different classes vary. For example, if there were 95 cats and only 5 dogs in the data, a particular classifier might classify all the observations as cats. The overall accuracy would be 95%, but the classifier would have a 100% recognition rate (e.g., true positive rate, sensitivity) for the cat class but a 0% recognition rate for the dog class.

SUMMARY

In an aspect, a method includes monitoring performance of a first generated model while the first generated model is deployed for use on live data, the monitoring including determining a first performance value of the first generated model; monitoring performance of a second generated model while the second generated model is deployed for use on live data, the monitoring including determining a second performance value of the second generated model; rendering, within a graphical user interface, a plot including a first axis and a second axis, the first axis including a characterization of a first performance metric and the second axis including a characterization of a second performance metric; and rendering, within the graphical user interface and the plot, a first graphical object at a first location characterizing the first performance value and a second graphical object at a second location characterizing the second performance value.

One or more of the following features can be included in any feasible combination. For example, the first axis can be indicative of a positive or a negative outcome; and wherein the second axis is indicative of a correct or incorrect prediction. A size of the first graphical object can be indicative of a scale of the first performance value. A size of the first graphical object can be indicative of a relative cost or a relative benefit. The first performance value can include a count of a positive outcome or a count of a negative outcome. The first performance value can include a count of a correct prediction or an incorrect prediction. The method can include adjusting a ratio of outcomes according to a count of records per period.

The first generated model can have been trained on historical data. The method can include determining future cost or net benefit of the first deployed model over time. The method can include rendering, within the graphical user interface, a characterization of the future cost or net benefit of the first deployed model over time. The first generated model can have been trained on historical data and each transaction in the live data includes an associated characteristic. The method can include determining future cost or net benefit of the first deployed model based on a change in distribution of transaction characteristics of the data source of the first model and over time. The associated characteristic can characterize a specific subgroup of the population, the specific subgroup including a geographic location associated with a respective transaction, a component failure, or a capacity measure. A distribution of transaction characteristics of the live data can be different than a training distribution of transaction characteristics of the historical data.

The method can include identifying, within the live data, subgroups of the live data; determining a performance metric for the first generated model and for each of the subgroups of the live data and over time; and rendering, within the graphical user interface, a characterization of the determined performance metric for each of the subgroups, wherein the characterization of the determined performance metric indicates a relative proportion size of a respective subgroup of the live data.

The first performance metric can include rate of false positive, count of false positive, cost of false positive, cost of overestimate, cost of underestimate, benefit missed by false positive, true positive, benefit of true positive, benefit of minimizing false positive, benefit of maximizing true positive, or a combination thereof. The second performance metric can include rate of false negative, count of false negative, cost of false negative, benefit missed by false negative, true negative, benefit of true negative, benefit of minimizing false negative, benefit of maximizing true negative, or a combination thereof.

The method can include monitoring a third generated model, the monitoring including determining a third performance value; and rendering, within the graphical user interface and the plot, a third graphical object at a third location characterizing the third performance value.

In another aspect, a method includes determining a plurality of candidate models using a model generator and a dataset, each of the plurality of candidate models including a respective model type; determining a performance of each of the plurality of candidate models; adjusting, based on the determined performance of each of the plurality of candidate models, a ratio of model types being generated; and determining additional candidate models using a model generator and the dataset, the additional candidate models including respective model types, the determining additional candidate models according to the adjusted ratio of model types being generated.

One or more of the following features can be included in any feasible combination. For example, each respective model type can include one of a set of model types. The method can include receiving data characterizing an objective where the adjusting is further based on the received objective. The method can include identifying, based on the determined performance, one or more models from the plurality of candidate models; and displaying, in a graphical user interface, data characterizing the determined performance of the identified one or more models. The determining of the plurality of candidate models can be according to an initial ratio determined from historic performance of similar data sets.

Non-transitory computer program products (i.e., physically embodied computer program products) are also described that store instructions, which when executed by one or more data processors of one or more computing systems, causes at least one data processor to perform operations herein. Similarly, computer systems are also described that may include one or more data processors and memory coupled to the one or more data processors. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including but not limited to a connection over a network (e.g. the Internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims.

DESCRIPTION OF DRAWINGS

Like reference symbols in the various drawings indicate like elements.

DETAILED DESCRIPTION

Figure 1:
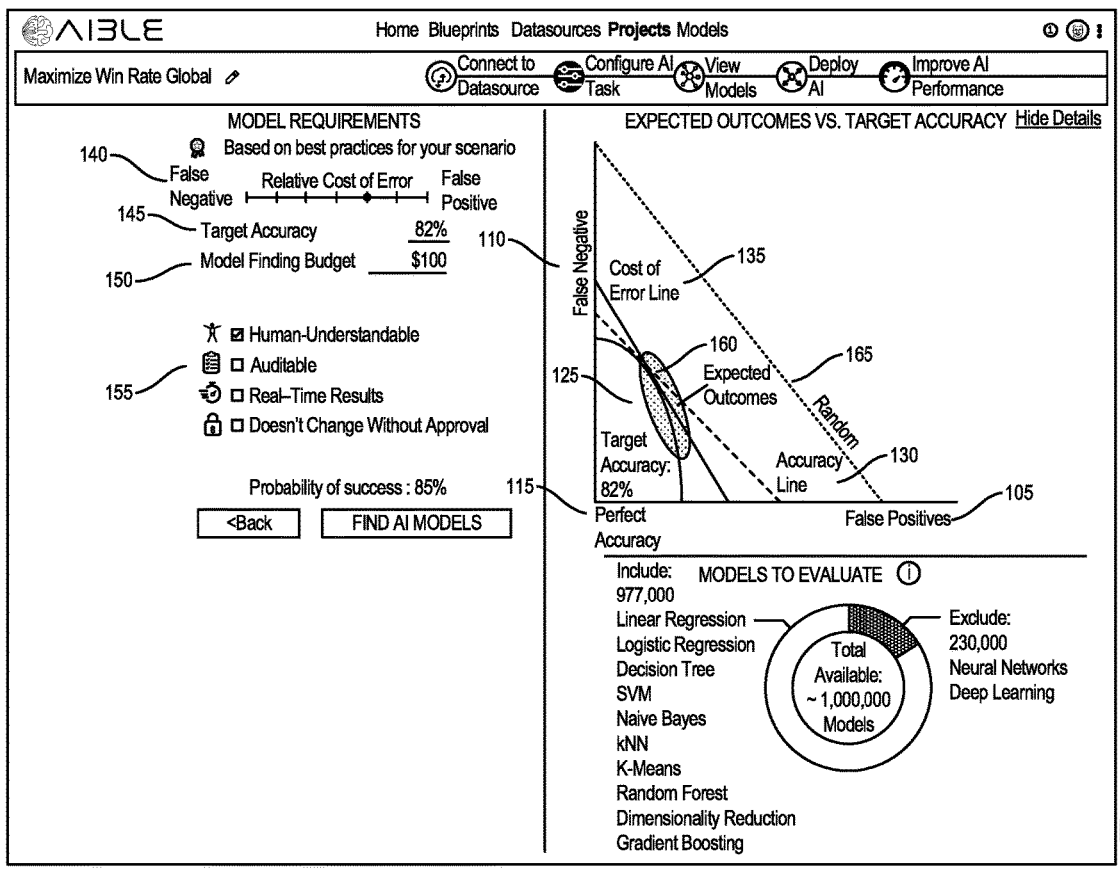
FIG. 1 illustrates an exemplary graphical user interface (GUI) display space for determining and/or assessing predictive models.

Some implementations of the current subject matter can include monitoring deployed models (e.g., live models deployed within an organization) and assessing their performance.

Accuracy in predictive analytics can be a misleading metric for characterizing performance of a classifier, for example, where a data set may be unbalanced, the cost of a false negative/positive is different, and the like. In some implementations, the current subject matter includes an improved user interface for visualizing and assessing models, such as predictive models (e.g., classifiers) and prescriptive models. The improved interface can enable deeper understanding of a model's performance, particularly for a non-expert business user. The performance of the model can be presented in a manner that conveys a complex performance assessment simply and in an intuitive format. For example, the improved interface can enable improved understanding of a predictive model's performance by presenting, in a single visualization, a model's false positive rate; false negative rate; a target accuracy; tradeoff between false positive rate and false negative rate; how biased a model may be as a result of an unbalanced dataset; and cost/benefit analysis.

The current subject matter is not limited to predictive modeling and can apply to a broad range of learning and predictive techniques. For example, the current subject matter can apply to prescriptive algorithms (e.g., making a certain change would change the output by an amount or percent), continuous variable predictions, and the like, and is not limited to classification. For example, the current subject matter can apply to models for continuous variables that can include establishing a percentage threshold or numerical threshold above which predictions can be considered to be overestimates or underestimates. For example, if the predicted revenue was more than 25% higher than the actual revenue, then it can be considered an overestimate. A prediction within 25%+ or − of the actual can be considered accurate, for example, although thresholds can be asymmetrical.

A target accuracy can be visualized within a rate of false positive versus rate of false negative plot and in a manner that can be indicative of data balance. In instances where the data is unbalanced, the target accuracy as presented visually can provide an intuitive representation that the data is unbalanced and to what degree. This can provide a user with a deeper understanding of the data without requiring specific domain expertise (e.g., pre-knowledge of the degree of unbalance within the data). In some implementations, data can be up sampled or down sampled for model training, and require an adjustment back to expected real world observation rates, or future expected rates.

The current subject matter can improve data and model understanding even without unbalanced data. Traditional measures like precision, recall, log-loss, and the like are complicated and can be difficult to compare multiple models visually against one another, particularly when the models are trained on different datasets or processes. Some implementations of the current subject matter include graphing attributes that are comparable across models, and graphing them in a manner such that models can be compared against one another easily and intuitively, even when the models relate to different domains.

Figure 2:
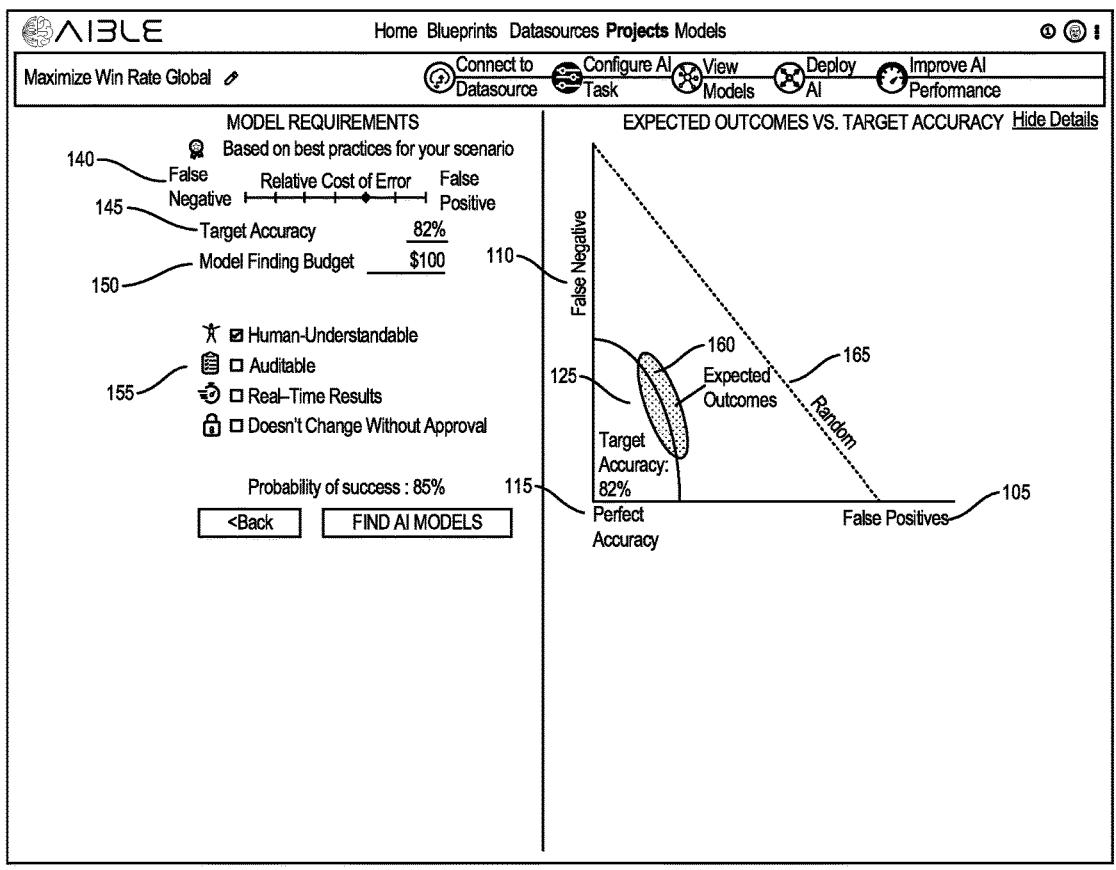
FIG. 2 is a variation of the example interface shown in FIG. 1.

FIG. 1 illustrates an exemplary graphical user interface (GUI) display space for determining and/or assessing predictive models. The GUI display space in FIG. 1 can include a graphical representation of the assessment of the predictive models. The graphical representation can provide the user with various information associated with the assessment of predictive models in an efficient manner. For example, the graphical representation can be indicative of predictive model characteristics and/or model requirements provided as an input by the user. The graphical representation can include information associated with the selected model types, performance metrics associated with the models, and the like. FIG. 2 is a variation of the example interface shown in FIG. 1.

In one implementation, the graphical representation can include a plot of performance metrics of the performance models. A first axis 105 (e.g., x-axis) of the plot can be representative of false positive rate, and a second axis 110 (e.g., y-axis) of the plot can be representative of false negative rate. As discussed more fully below, the axis can be representative of other or additional performance metrics. The origin of the plot 115 can be representative of perfect accuracy (e.g., no false positives and no false negatives). A performance metric of a performance model can be represented by a graphical object 120 (e.g., a point, an asterisk, and the like, illustrated in FIG. 3). In some implementations, a shape and/or color the graphical object can indicate a characteristic of the model. For example, triangular graphical objects can indicate a model is of low complexity, a square can indicate a model is of medium complexity, and a circle can indicate a model of high complexity. Other shapes and model characteristics are possible. The location of the graphical object can be indicative of false positive rate value and false negative rate value associated with the performance of the model.

A location of the graphical object can be representative of the false positive rate and false negative rate associated with the performance model. For example, a location of the graphical object with respect to the x-axis 105 can be representative of false positive rate of the performance model, and location of the graphical object with respect to the y-axis 110 can be representative of false negative rate of the performance model. Accordingly, a distance of the graphical object from the origin can be representative of an effective accuracy associated with the performance metric. For example, as the distance from the origin increases, the effective accuracy associated with the performance metric decreases, and vice versa.

The plot can include a visual representation of predictive model characteristics provided by the user. For example, input target accuracy can be represented by a color-coded region ("light green") 125 on the plot. The color-coded region can include the origin of the plot (e.g., representative of perfect accuracy) 115. The shape of the color-coded target region 125 can be determined by an arch tangent to the relative cost curve 135 and/or the accuracy curve 130, can include a conic section such as hyperbola, parabola, or section of ellipse, and the like. The entirety of the target area 125 can be bounded by the target accuracy, target cost curves 135, and the perfect model point (e.g., origin) 115. The size of the color-coded region 125 can be inversely proportional to the input target accuracy. Presence of the graphical object 120 in the color-coded region 125 can indicate that the performance of the model has an accuracy greater than or equal to the input target accuracy. Additional color coded regions can be added to show accuracy bands representing an accuracy scale or the performance of random selection.

In some implementations, and as illustrated in FIG. 1, the interface for visualizing and assessing predictive models can be included in a platform and/or interface enabling improved predictive model generation. In the platform, a target accuracy 145, a relative cost of error 140 (e.g., false negative and false positive), model requirements 155 (e.g., whether it is human-understandable, auditable, capable of providing real-time results, and doesn't change without approval), and a budget for model development 150 can be specified by a user. Based on the input, a prediction as to the probability of developing a predictive model with the requested parameters can be determined and presented to the user. By predicting a probability of successfully developing a predictive model with the requested parameters, the current subject matter can provide a user with an indication of what model performance may be achieved and without having to develop and test a number of candidate models. Further, such an approach can inform a user if a model with the specified requirements is unlikely to be developed or not feasible.

The GUI display space can include one or more interactive graphical objects through which a user can input predictive model characteristics, model requirements, and the like. The predictive model characteristics can include, for example, relative cost of error of the model (e.g., ratio between the cost impact of false positive results and false negative results of the model), target accuracy of the model, model finding budget, and the like. The model requirements 155 can include, for example, that the model be human-understandable (e.g., the trained model can be analyzed and understood by a user, a characteristic not possessed by deep learning algorithms, for example). The model requirements 155 can include, for example that the model be auditable, a characteristic that can indicate whether the model type is capable of exporting aspects of the model and/or decisions made to a format for review by a regulator or other entity. The model requirements 155 can include, for example, that the model provide real-time results, a characteristics that can indicate whether the model requires batch mode processing to perform a prediction. The model requirements 155 can include, for example, that the model doesn't change without approval (e.g., is immutable), a characteristics that can indicate whether the model is changing as interactions happen (e.g., when the model is live). Other requirements are possible.

A user can provide user input by typing input values (e.g., value of target accuracy, model finding budget, and the like), clicking on an interactive object representative of an input value (e.g., icons), dragging a sliding bar (e.g., sliding bar representative of relative cost of error), and the like. In some implementations, initial settings can be provided by automated recommendations generated by an artificial intelligence application trained on historical user input. The user can initiate a search for model types based on the user input (e.g., by clicking on "Find AI Models" icon).

Based on one or more user inputs, model recommendations can be displayed on the GUI display space. The model recommendations can be generated by a predictive model generator that can receive user inputs and generate one or more predictive model recommendations based on the input. The model recommendations can include, for example, a selected list of model types (e.g., linear regression, logistic regression, K-means, and the like), number of desirable model types, total number of available number types, and the like. A first predictive model can be generated for a first model type in the selected list of model types. This can be done, for example, by training a first model associated with the first model type with a first portion of a predetermined training data. The first performance model can be evaluated (e.g., in real-time) based on a second portion of the predetermined data. One or more performance metrics (e.g., false positive rate, false negative rate, and the like) can be calculated for the first performance model.

The plot can further include a second color-coded region indicative of a system estimate of expected outcomes 160 (also referred to as a zone of possibilities). A zone of possible models 160 can be determined from a relative cost of error (e.g., false negative and false positive), model requirements (e.g., whether it is human-understandable, auditable, capable of providing real-time results, and doesn't change without approval), and a budget for model development. The zone of possible models 160 can estimate or predict likely achievable model performance such as false positive rate, false negative rate (overestimate max, underestimate max). In some implementations, the zone of possible models 160 can be determined with a predictive model trained on observations of users utilizing the platform, including characteristics of the data (e.g., metadata relating to the training data), what model requirements are selected, what computational resource budgets are utilized (e.g., resources, servers, computational time, and the like), and the performance of models generated from those user inputs. The characteristics of the data can include metadata such as number of rows, columns, number of observed values for each variable (e.g., degrees of freedom), standard deviation, skew, and the like. In an implementation, the actual underlying data is not required, rather a metric or determination of data complexity and observations regarding which kinds of algorithms performed well against which kinds of data, how long they took to train, and the like.

As illustrated for example in FIG. 1, the zone of possible models 160 can be visualized within a rate of false positive versus rate of false negative plot and, similar to the target accuracy and in some implementations, in a manner that can be indicative of data balance. If it is predicted that a model meeting the user input model requirements is possible, the expected outcomes region can be visualized as overlapping with a region indicative of the target accuracy, and can be color coded (e.g., green). If it is predicted that a model meeting the user input model requirements is not possible (or low likelihood), the expected outcomes region can be visualized as not overlapping with the region 125 indicative of the target accuracy, and can be color coded accordingly (e.g., orange). The size of the expected outcomes 160 can be indicative of the range of possible accuracies. For example, the larger the size of the expected outcomes region 160, the larger the range of possible models. Distance of the expected outcomes from the origin of the plot can be inversely proportional to accuracies of predictive models likely to be generated.

In some implementations, the plot can include an accuracy line 130 indicative of a constant accuracy (e.g., a line characterizing the sum of false negatives and false positives remaining constant). By visualizing a constant accuracy (e.g., constant value for sum of false negatives and false positives), a user can understand the relative tradeoff between the two metrics and further, when comparing performance of multiple models, can choose a model that may be less accurate and/or have a similar accuracy, but a more balanced false negative rate and false positive rate. The distance of the expected outcomes from the target accuracy region can graphically express a likelihood of finding the model with a performance that fits the user's performance requirements.

In some implementations, the plot can include a cost of error line 135 indicative of accuracy as weighted by a relative cost of error. Such a cost of error line 135 can reflect a user input indicating that false negatives are more costly than false positives, or vice versa. In other words, the cost of error line 135 can reflect a utility or cost function in which the cost of false negatives and the cost of false positives are not equal.

In some implementations, the plot can include a random error line 165 indicative of accuracy of a model that randomly chooses an outcome. For example, if the model is a binary classifier and the model randomly chooses one of two outputs with a probability ratio equal to the frequency of occurrence in the data, (e.g., if 90% of the data is true, a random model will select true randomly 90% of the time), the random error line 165 indicates the accuracy of the model. By plotting the random error line 165 alongside a model's performance, the visualization can provide a reference point for interpreting a model's performance relative to a random model (e.g., which can represent a lower end on model performance).

Figure 25:
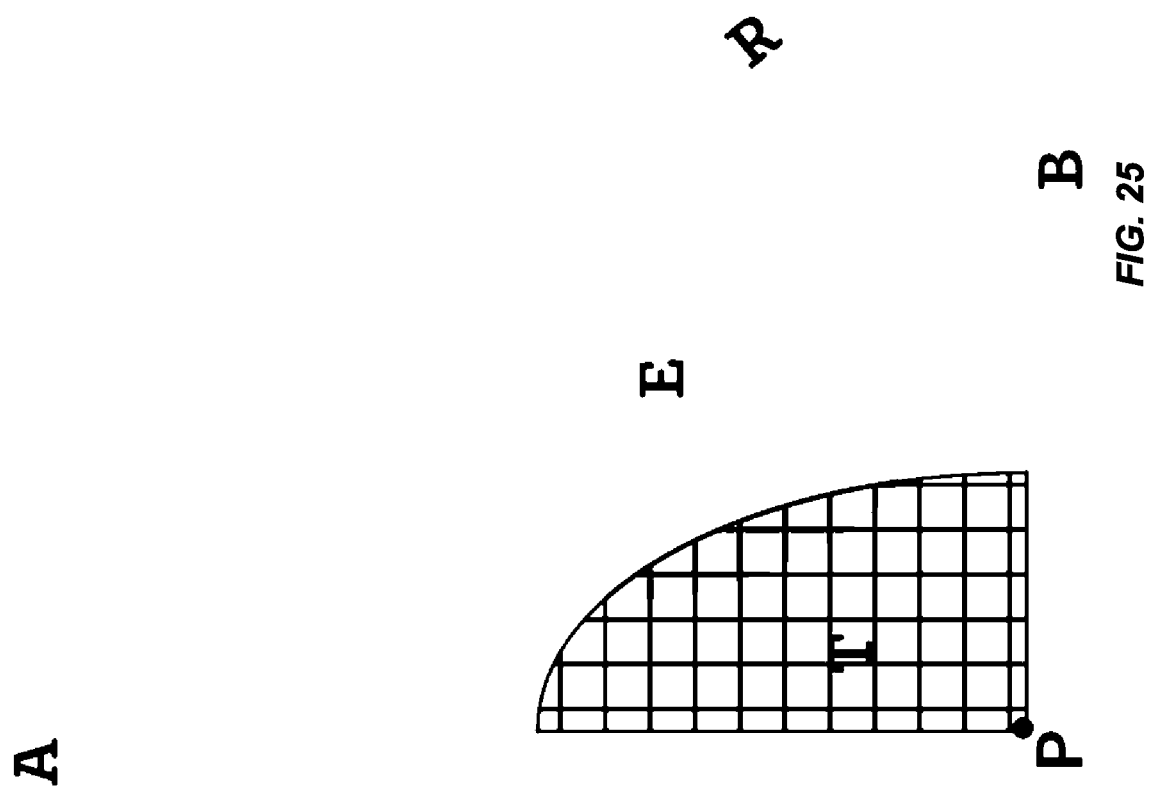
FIGS. 25-33 illustrate additional example implementations of plots for visualizing model performance.

FIG. 25 is another example implementation of a plot for visualizing model performance. Axis A and B can include a characterization of false positive and a characterization of false negative, respectfully. P can indicate the perfect model point, T can indicate the target area, E can represent the expected outcome range, and R can represent the random model line. In some implementations, the characterization of rate of false positive can include rate of false positive, count of false positive, cost of false positive, benefit missed by false positive, true positive, benefit of true positive, benefit of minimizing false positive, projected benefit of true negative over a specified future time period (such as 1 month), or benefit of maximizing true positive. The characterization of rate of false negative can include rate of false negative, count of false negative, cost of false negative, benefit missed by false negative, true negative, benefit of true negative, benefit of minimizing false negative, projected benefit of true positive over a specified future time period (such as 1 month), or benefit of maximizing true negative. In some implementations the projected benefit can relate to any cost or benefit metric. The lower limit for accuracy, R, can indicate a random model, or a trivial model such as always True or always False, or an existing model.

Figure 26:
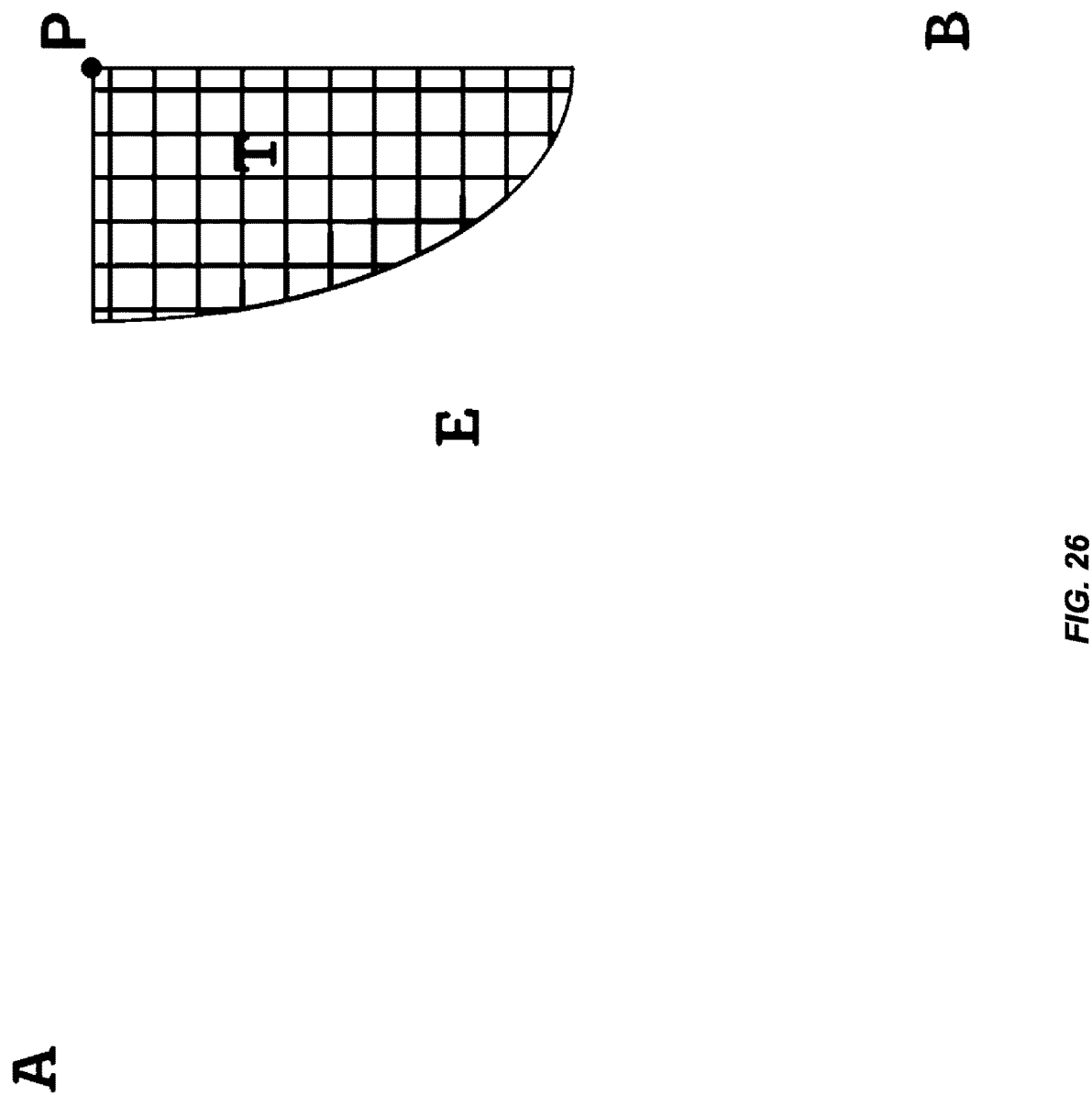

FIG. 26 illustrates another example implementation of a plot for visualizing model performance. FIG. 26 is similar to that shown in FIG. 25, although the A and B axes are flipped illustrating true positive/true negative, benefit of true positive/true negative, overall benefit of minimizing false positive/false negative, or maximizing true positive/true negative.

Figure 27:
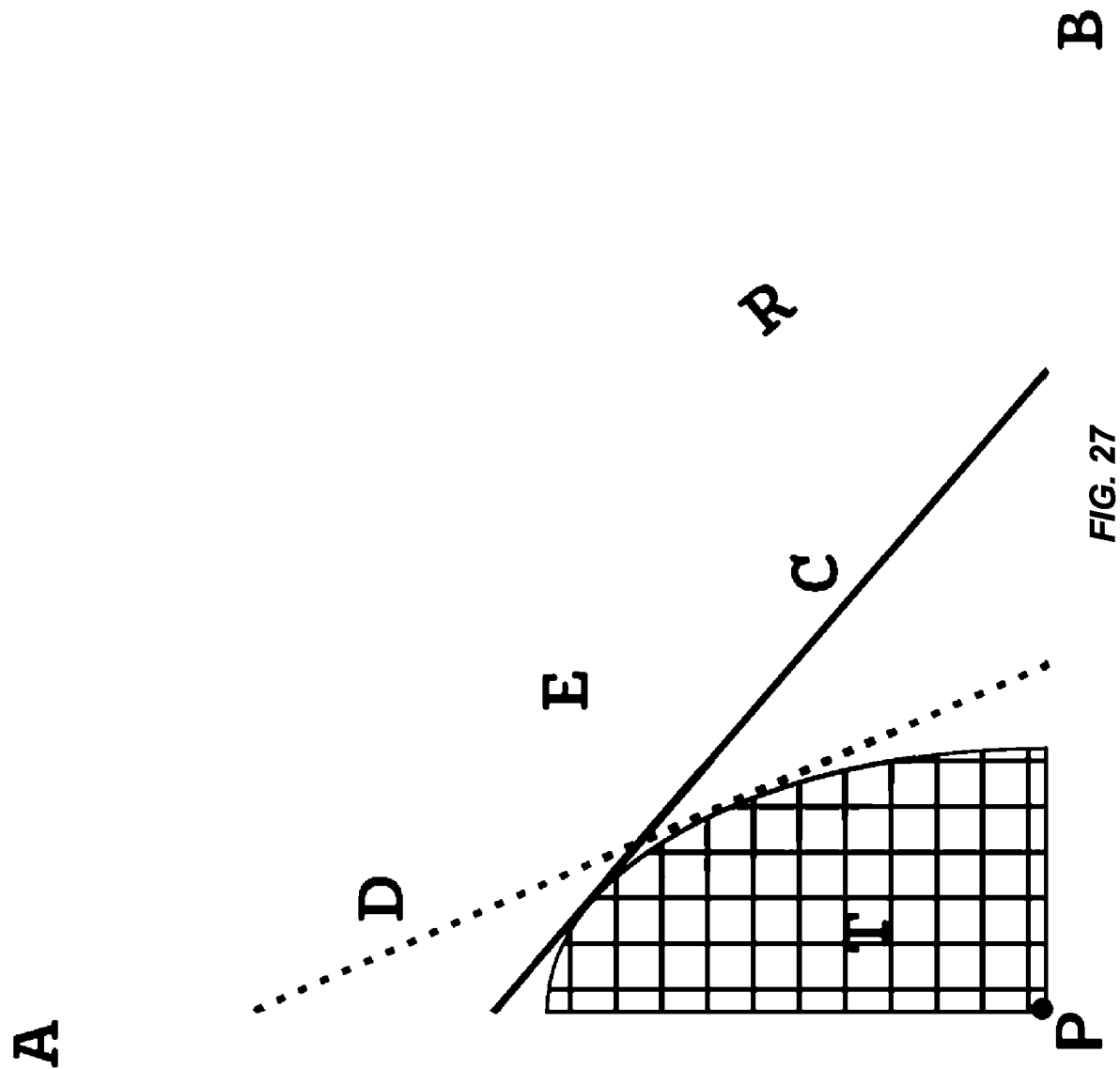
Figure 28:
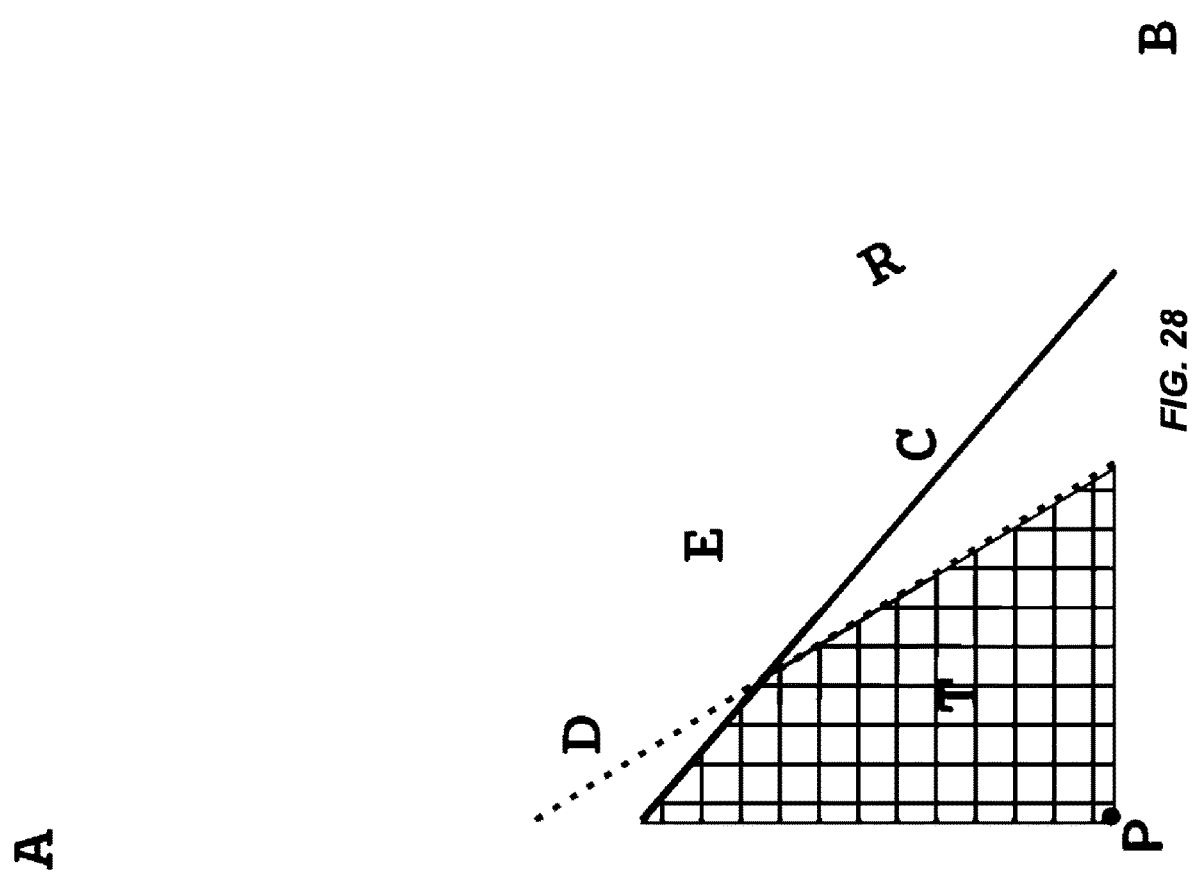
Figure 29:
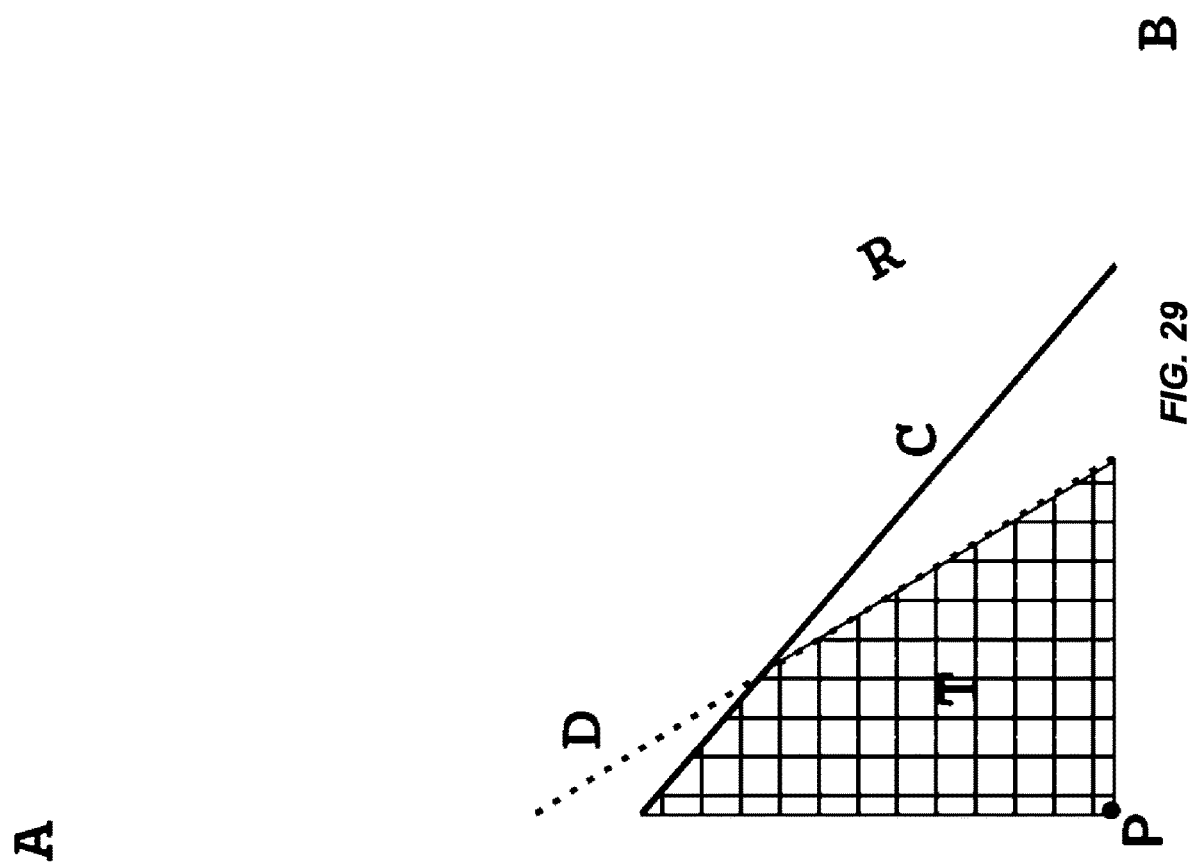
Figure 30:
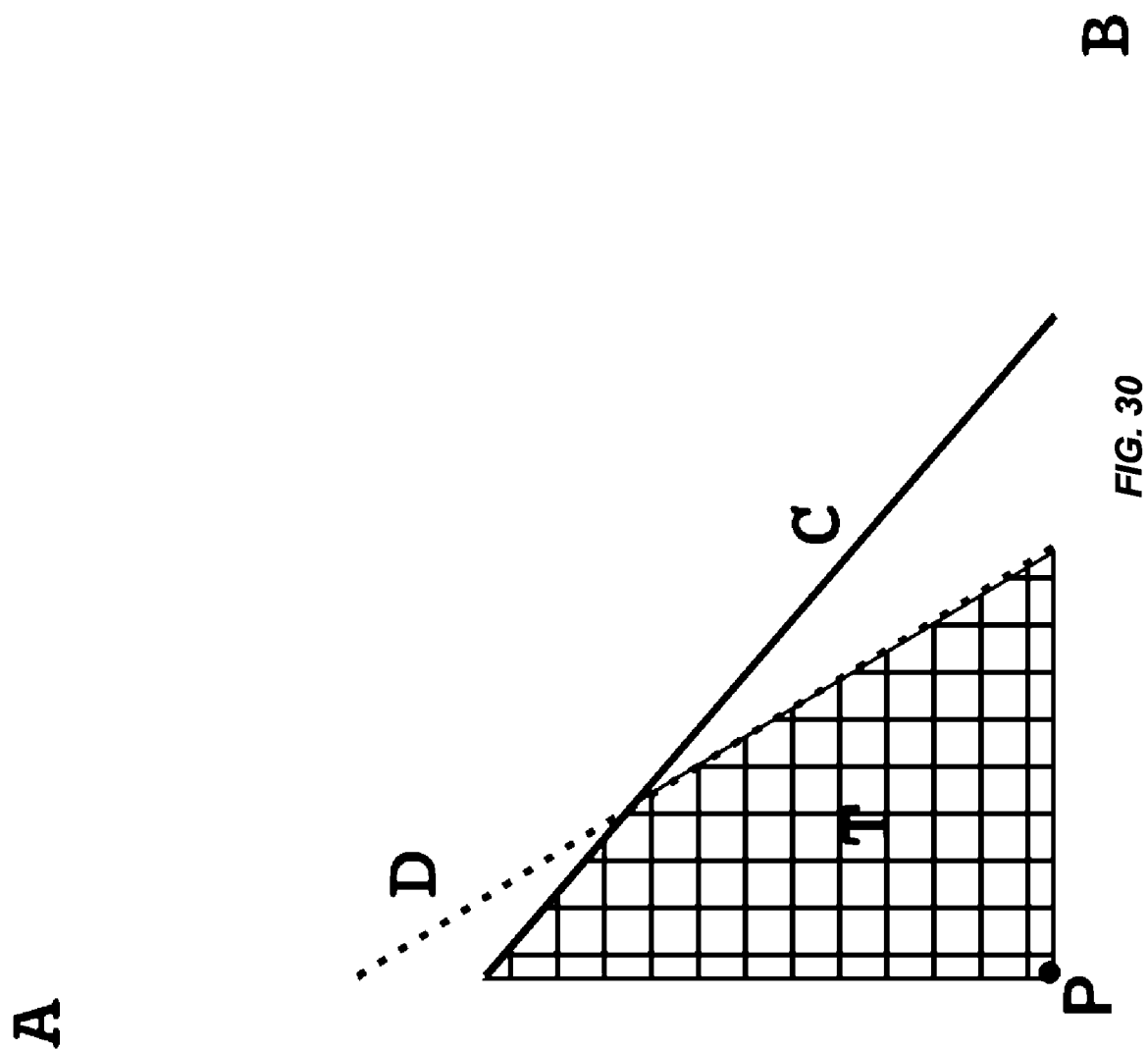
Figure 31:
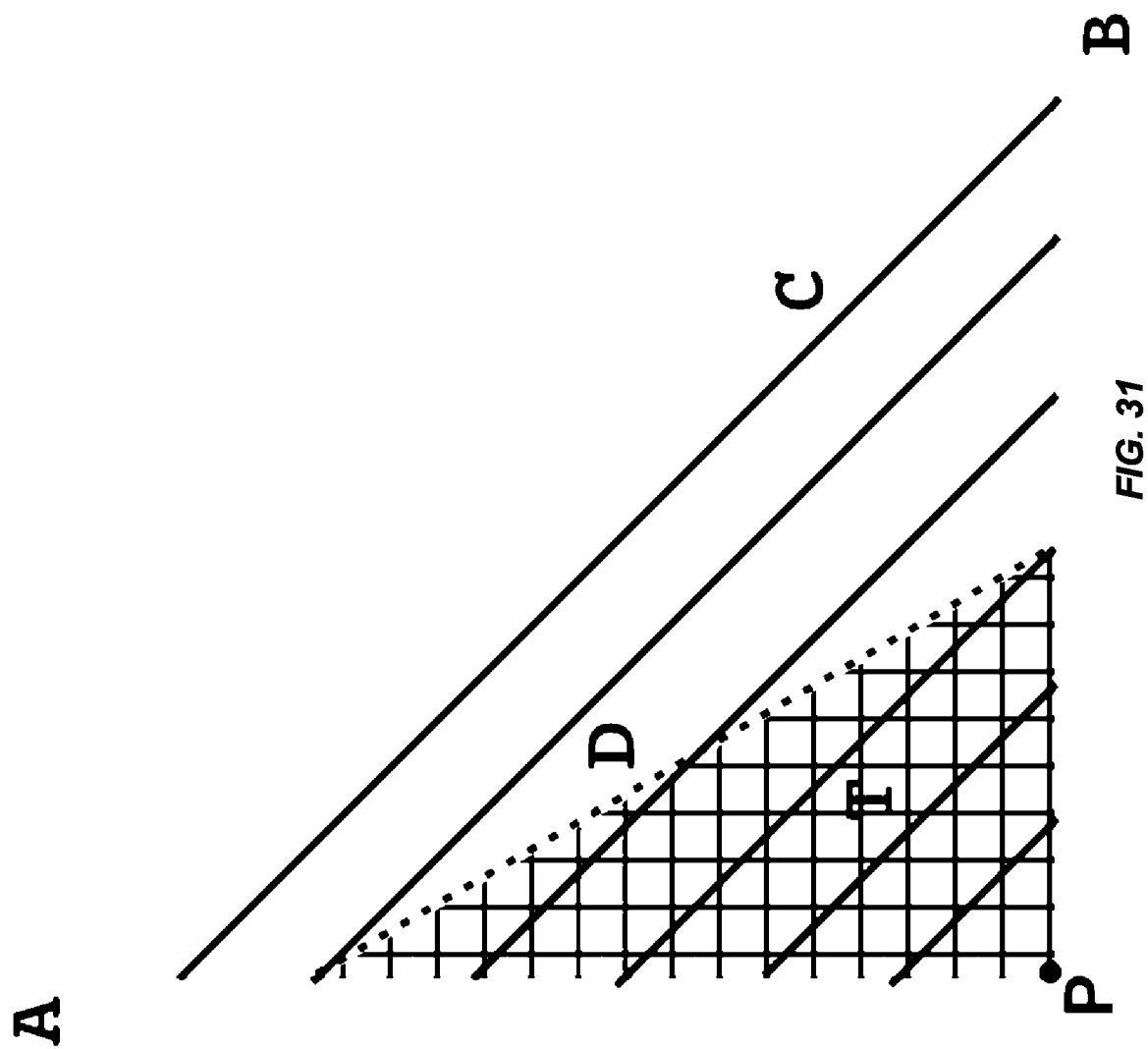

FIG. 27 illustrates another example implementation of a plot for visualizing model performance. In FIG. 27, constant cost C and constant accuracy D curves are illustrated. The target T is bounded by both constant cost C and constant accuracy D. FIGS. 28-30 illustrate additional example implementation of a plot for visualizing model performance. The target area T can be the entire region bounded by C and D, rather than a curve. FIG. 31 illustrates another example implementation of a plot for visualizing model performance in which the target T is bounded by D and isolinear lines C define a scale of constant accuracy or constant cost levels. The isolinear lines enable an intuitive visualization for constant cost or accuracy across a range of costs and accuracies. The target area T in can be represented by a curve (e.g., curve tangent, conical curve, hyperbola, parabola, ellipse, and the like) to D.

Figure 3:
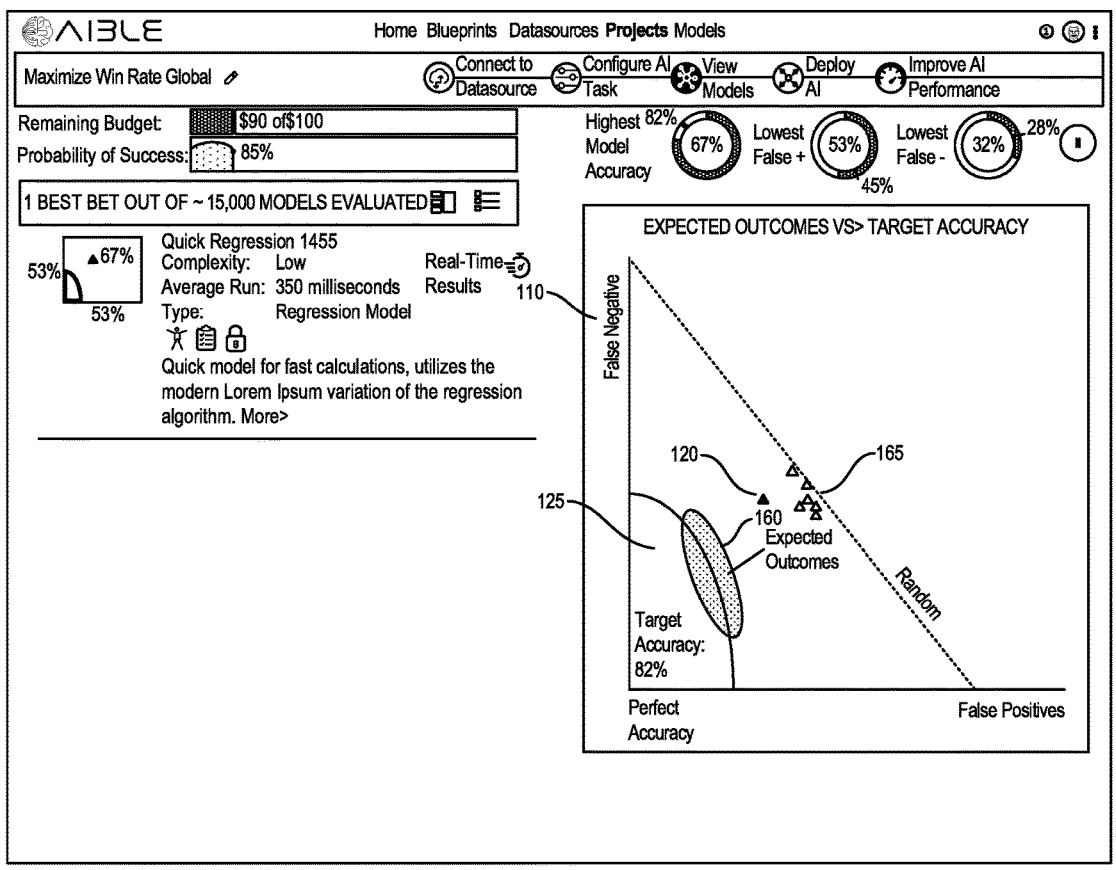
FIG. 3 is an example interface illustrating visualization of multiple candidate model performance during generation of candidate models.

Referring again to FIG. 1, once target accuracy, model finding budget, and model requirements are input, the platform, in response to a user selecting "find AI models" can start to generate candidate predictive models including training those models and assessing their performance. As models are generated and their performance is assessed, their performance can be plotted on the plot of false positives versus false negatives. FIG. 3 is an example interface illustrating visualization of multiple candidate model performance during generation of candidate models. After each candidate model is generated, its performance can be plotted on the plot. In addition, a remaining budget can be updated (e.g., to illustrate how much of the budget has been spent on model building) as well as a probability of successfully generating a model that will achieve the target accuracy. In some implementations, the graphical objects (e.g., 120) can appear in the plot in real-time providing the user with an up-to-date snapshot of the model generation process. By assessing model generation in real-time, including knowing the remaining budget, probability of success, and candidate model performance, the current subject matter can provide an interface that enables a user to make decisions regarding the model generation process, such as terminating the process early if it is unlikely that a model with be generated with the required accuracy. The interface in FIG. 3 can present the highest model accuracy, lowest false positive rate and lowest false negative rate for the candidate models that can been generated.

Figure 4:
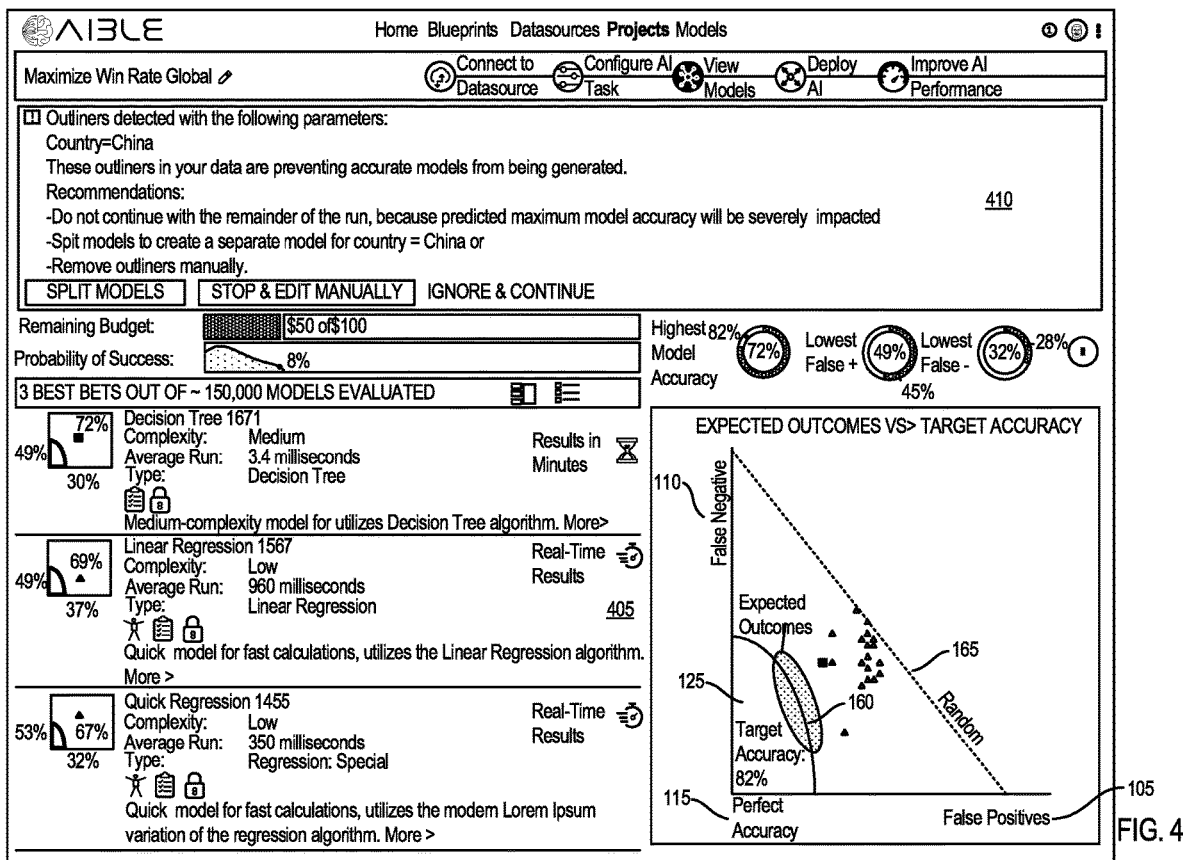
FIG. 4 illustrates an example of juxtaposing details of multiple candidate model performance relative to one another.

The platform can generate a number of candidate models, assess their performance, and display their performance visually and juxtaposed to convey performance of a model relative to one another in a simple and intuitive manner. Such an approach can enable a user to develop multiple candidate models and choose, from the multiple candidate models, one or more final models. FIG. 4 illustrates an example of juxtaposing details of multiple candidate model performance relative to one another. The interface enables a user to select one or more model graphical objects (right), and list details 405 of the generated model (left). In some implementations, details of the top performing models can be listed left in order of performance. In addition, the listing of model details can include a graphical object representing the performance of the model relative to the target accuracy. The graphical object can be in the form of spark line doughnut, pie, bar chart, and/or the like. By visually representing the performance of a model in the spark line object adjacent or within details of the model, a list of candidate models can be scanned quickly for consideration by the user.

In more detail, FIG. 4 illustrates an exemplary GUI display space that can provides the user with the results of prediction model generation (e.g., by the predictive model generator). The GUI display space in FIG. 4 can include the plot described in FIG. 1. The plot can include graphical objects that are indicative of performance metrics of the generated predictive models ("candidate models"). One or more of the graphical objects can be visually discernable (e.g., highlighted) in the plot, and information of candidate models associated with the discernable graphical object can be presented adjacent to the plot. Additionally the user can highlight additional model indicators using a mouse or touch interaction and get additional information on the desired objects. Predictive model information can include one or more of name of the model, model type, time taken to generate the predictive model, complexity of the model, model accuracy, and the like.

The GUI display space in FIG. 4 can include a graphical object indicative of the available budget for searching/determining predictive models. The GUI display space can include a graphical object indicative of a likelihood of success in determining a predictive model having desirable model characteristic (e.g., desirable target accuracy). The GUI display space can include graphical objects that indicate the highest accuracy value, the lowest false positive value, the lowest false negative value, and the like, of the generated candidate models.

In some implementations, the GUI display space in FIG. 4 can automatically update in real-time. For example, the new graphical objects can appear in the GUI display space and/or existing graphical object can be replaced with updated graphical objects. The updates can be based on new results generated by the predictive model generator (e.g., generation of new predictive models). For example, when a new candidate model is generated, a graphical object associated with the performance metric of the newly generated candidate model may appear in the plot. Graphical objects associated with available budget, probability of success, highest model accuracy value, lowest false positive value, and lowest false negative value can be updated.

Determining the optimal modeling technique requires an understanding of the business objectives as well as the performance tradeoffs of different techniques. It can often be difficult to know the optimal selection at the beginning of a modeling project. As models are run, additional information is revealed. This information can include model fit statistics for different types of models, relative predictive value of terms and interactions, subgroups with lower or higher accuracy predictions than average. For example, as models are developed, a specific class of models may be performing well relative to other classes of models and with a current dataset even though the specific class of models may have not performed as well for similar datasets in the past.

This approach can start with a mix of models (e.g., an ordered list of model types to train with the data set) biased to the desired objective (e.g. lowest complexity, highest accuracy). For example, if a user is looking for a low-cost auditable model with real time predictions, the model mix can primarily select algorithms that typically produce smaller models that are auditable and capable of being deployed for real time predictions, like logistic and linear regression. For a user looking for the highest possible accuracy, with a large budget, who is willing to run batch scoring, the model mix can primarily select algorithms that tend to produce the highest accuracy for similar datasets, like deep learning and neural net. If historically simpler models like linear regressions have performed well on similar datasets while more complex models like deep learning have relatively not performed well, then the initial mix (e.g., an initial ordered list of model types, a set, and the like) may include model types with a lower complexity.

In some implementation, a small sampling (e.g., one, two, etc.) of complex models can be included to the mix (e.g., ordered list, set, and the like) to determine if the higher complexity models perform significantly better than the simpler models for the given dataset.

Other types of models can also run (e.g., be trained) to determine how additional model types perform. While the model mix can be determined by the user's business objectives, other modeling types may be run to determine the optimal model type. For example, the user looking for the highest accuracy might expect a neural net, or deep learning model to produce the best predictions, however, running a few decisions trees, or linear regressions may reveal that the more sophisticated models are only marginally higher accuracy, in this case the user might want to focus further development on simpler models to reduce cost and gain the benefits of less complex models. In the run for the user looking for real time predictions, if the model mix only ran simpler models, the user may not realize that a more advanced model might produce significant accuracy gains. Running a few advanced models could identify higher accuracy models that might be worth trading off some desired functionality of simpler models.

In some implementations, the initial model types to use for generating candidate models can include primarily models of a type expected to perform better based on historical data, representative examples of different classes of algorithms can be included to confirm that a given dataset performs similarly to historically similar datasets.

Based on the performance results of various model types, the ratio of model types being run can be adjusted in an attempt to maximize the desired outcome, within stated business objectives. Within the set of model types that meet a user's business objectives, certain model types can outperform others, as the initial model runs complete, certain types of models may emerge as leading candidates for delivering the best model performance for the data. The model mix can then adjust, increasing the percentage of models run that are similar to the types of models that have shown positive results. The top performing models that fit the stated business objective can be identified and presented to the user. For example, if more complex models are performing better for a given dataset, even though simpler models had performed better for similar datasets in the past, then a greater proportion of complex models will be tested in this case. Historic performance of similar datasets can determine the initial mix of models (e.g., list, set, and the like), the mix can be updated during the model development process as more information about the performance characteristics of the specific dataset is determined.

In some implementations, the user can specify a model characteristic such as explainability that can exclude certain classes of models that are expected to perform well for this type of dataset. The system can run a small number of such models regardless to quantify the impact of the model characteristic choices. If model types that do not fit the stated business objectives are found to have better performance, users can be notified and provided an opportunity to revisit their business objectives. For example, the system can point out that deep learning models were 15% more accurate than explainable models and then the user can revisit the decision to exclude models that were not explainable.

Figure 10:
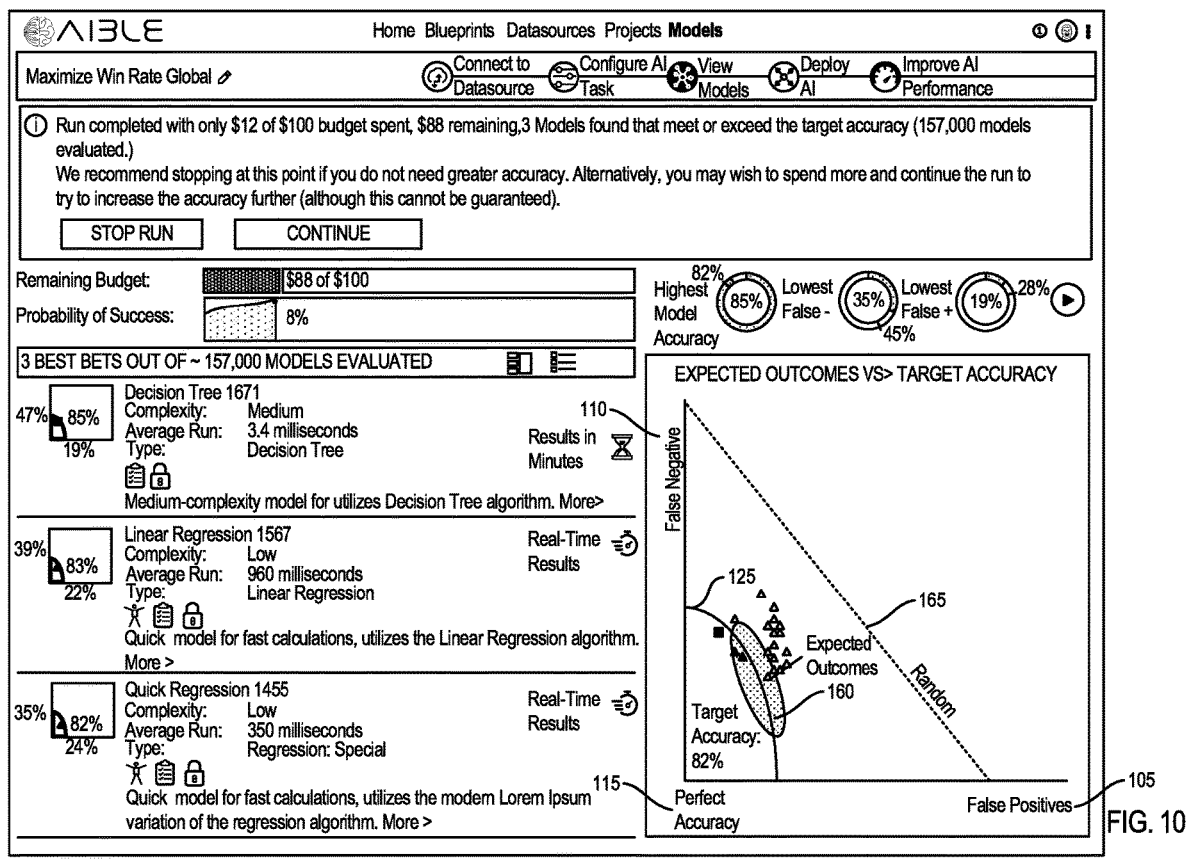
FIG. 10 is an example interface illustrating a prompt to a user when a model is generated that achieves the target accuracy.

In the instance where one or more generated models achieves the target accuracy, the platform can prompt a user to input whether they want to continue with the model building process. FIG. 10 is an example interface illustrating a prompt to a user when a model is generated that achieves the target accuracy. Since the target accuracy is achieved a user may wish to not spend the entire model building budget. A recommendation can be provided.

Figure 5:
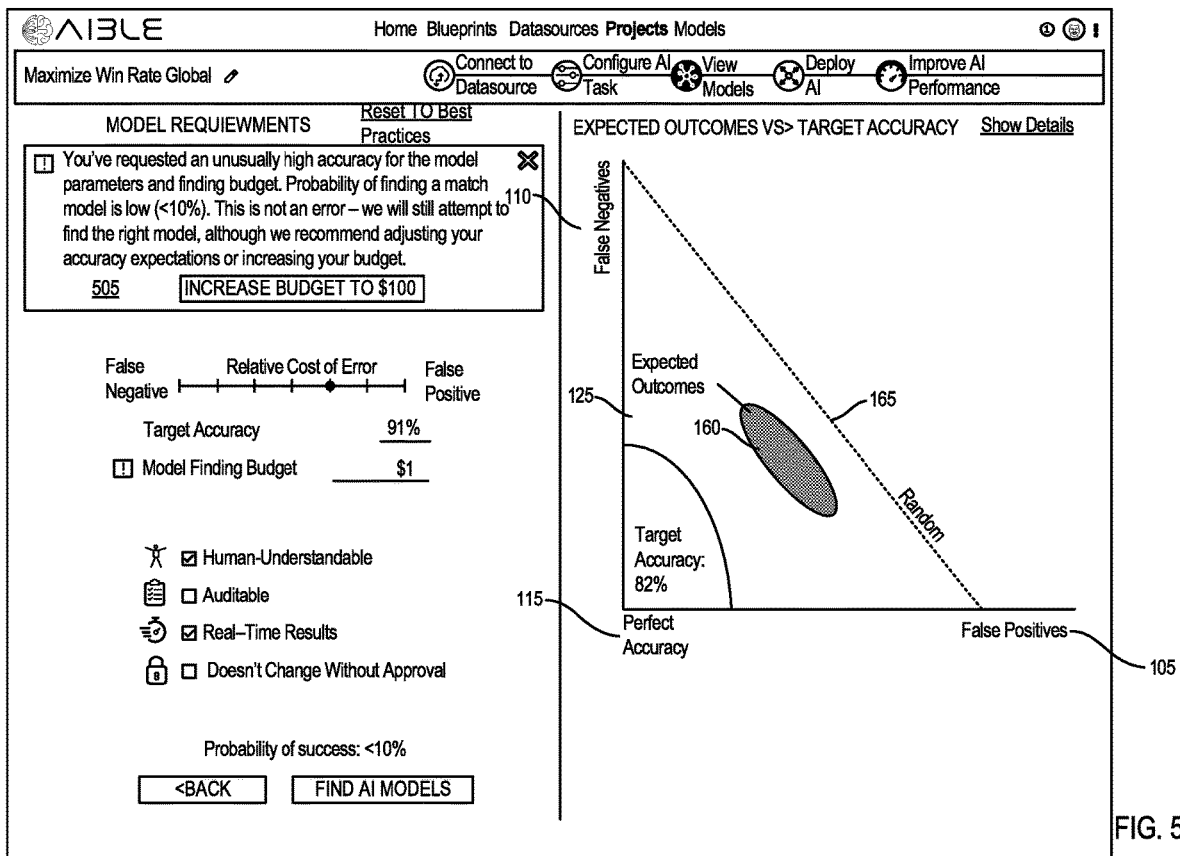
FIG. 5 illustrates the interface providing a recommendation to increase the model finding budget where the system has predicted that the probability of generating a model that meets the requirements is low.

In some implementations, the model generation platform can learn from user input and model generation regarding what approaches to model generation results in quality predictive models. For example, the model generation platform can learn, over time, best practices for model development. Based on those best practices and in some implementations, the model generation platform can provide recommendations to a user during the model building specification and during generation. For example, the model generation platform can identify that a certain type or class of models would likely result in a better performing model based on the balance of the dataset used for training and the required accuracy. As another example, the model generation platform can identify that a user has specified a budget that is too low given the target accuracy, and recommend a new budget that would result in a higher probability of finding a model to achieve the target accuracy. For example, FIG. 5 illustrates the interface providing a recommendation 505 to increase the model finding budget where the system has predicted that the probability of generating a model that meets the requirements is low. As a result, the expected outcomes is illustrated as non-overlapping with the target accuracy. The model generation platform can also automatically act upon the learned best practices, for example, optimizing which models are trained on which types of servers based on which classes of models are more likely to benefit from more expensive resources such as servers with GPUs or greater amounts of memory, and which classes of algorithms can be assigned to cheaper servers without cost impact. As more powerful servers cost more per hour, the model generating platform can leverage best practices learned from historical runs to optimize the expected total cost of training a set of models by allocating models optimally to the type of servers that would minimize the total cost of training such models.

FIG. 5 illustrates an exemplary GUI display space that indicates to the user that the predictive models cannot be generated based on the user inputs (e.g., predictive model characteristics, model requirements, and the like). For example, higher target accuracies of predictive models can require larger computational resources and/or longer computational times. This can result in higher budgets required to search/generate predictive models of higher target accuracies. If the model finding budget provided by the user is less than the expected budget, the GUI display space can indicate to the user that the model finding budget is likely deficient. Additionally, a recommended budget that is likely to be sufficient for searching/generating predictive models having desirable characteristics provided by the user (e.g., input target accuracy) can be provided in the GUI display space. In some implementations, the plot in the GUI display space can display the first color-coded region representative of the target accuracy and the expected outcomes.

In some implementations, the model generation platform can automatically identify subgroups of data within a dataset during model generation and/or for a model that is in production (e.g., being used for classification on real data, is considered "live", and the like) for which the model has a lower performance relative to other subgroups of data. A recommended course of action for the user can be provided to improve the associated predictive model. These recommended courses of action can include terminating further training of the model, creating a split-model (e.g., an additional model for the lower performing subgroup), and to remove the subgroup from the dataset. If multiple models all underperform with the same subgroup, then that subgroup can be flagged for additional action. An interface can be provided during the model generation process for implementing the recommendation, including terminating model generation, splitting the model, and modification of the training set. For example, FIG. 4 illustrates an interface during model generation in which underperforming subgroups have been identified, and a recommendation 410 to take action to improve model performance is provided. The recommendation 410 can include splitting models, terminating the remainder of the model generation run, and to remove subgroups manually. FIG. 21-24 illustrate additional example interfaces that can visualize subgroups for which the models are underperforming and provide a recommendation to take action to improve model performance.

If multiple models all underperform with the same subgroup, then that subgroup can be flagged for action as the data quality for that subgroup is likely poor or the underlying behavior for the subgroup is more unpredictable. Additional information can be gained by the relative performance of different model types across subgroups. Subgroups that perform better with models using higher order interactions of terms can indicate interactions are more important within these subgroups. The system can also automatically generate derived variables (e.g. combination of product and country) based on an automated evaluation of which specific variable interactions are performing the best in such models. These derived variables can then be made available to simpler models that do not consider higher order variable interactions. Subgroups with exceptionally high accuracy can indicate areas where post-outcome information (e.g., data leakage) existed in the training data that may not have been known prior to the event. (e.g., units sold used in a prediction of revenue). Findings in these subgroups can be used to improve data quality or recommend the classes of models most likely to perform for various subgroups.

The practice of generating specific models for underperforming subgroups, and running a large number of models poses the risk of overfitting the data. This risk can be mitigated by recommending simpler models that have similar performance characteristics to more complex models or by using several advisor models in combination. The system can optimize ensemble models by observing which classes of algorithms perform better as an ensemble based on the historical performance of such ensembles on datasets with similar characteristics.

In some implementations, a score or other metric of data subgroup performance can be monitored across subgroups for a model. Data subgroups can be flagged and visualized, along with their performance and over time. FIGS. 17-20 illustrate additional example interfaces that can enable a user to analyze the data subgroup performance. In some implementations, this visualization can be provided for multiple models, allowing analysis of a common subgroup for multiple models over time. For example, if a data subgroup relates to transactions originating in China, the visualization can enable analysis of multiple model's performance against all transactions originating in China and over time. In some implementations, the data subgroup associated with China can be automatically flagged as underperforming for analysis. Multiple subgroups can be presented in an ordered list based on their relative impact on overall model performance. Such an approach can enable improved model generation and performance.

Figure 6:
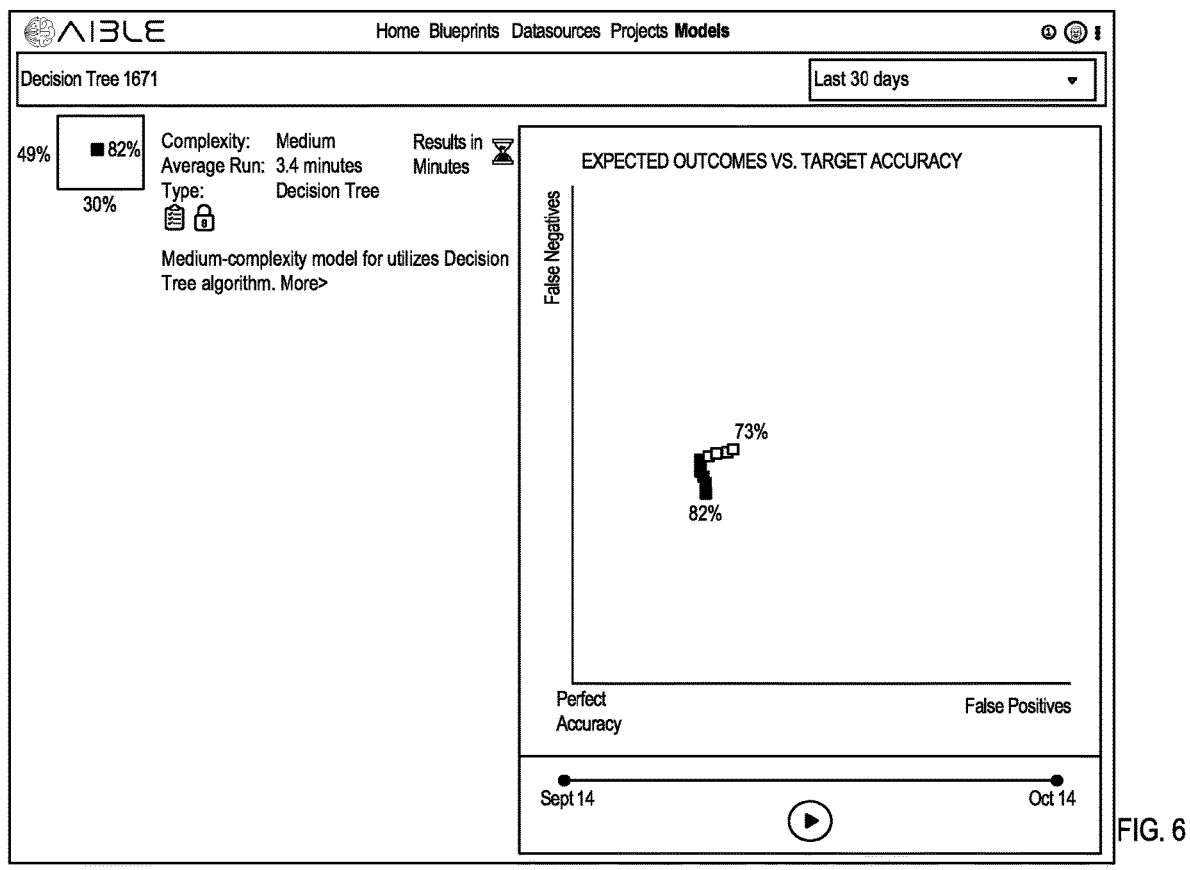
FIG. 6 illustrates the performance of a model over time.

In some implementations, the model generation platform can monitor performance of a generated model while the generated model is in production (e.g., being used for classification on real or live data). The model generation platform can assess performance of the model over time and present an interface that shows the performance varying over time. Such an interface can include worm plots showing the assessed performance at different points in time. An interactive graphical control can be included that allows a user to move between different points in time. By visualizing model performance over time, model understanding can be improved. For example, FIG. 6 illustrates the performance of a model over time. An interactive graphical control is included below the plot of false positives and false negatives and enables a user to move through time to assess performance and other characteristics of the model over time.

Figure 7:
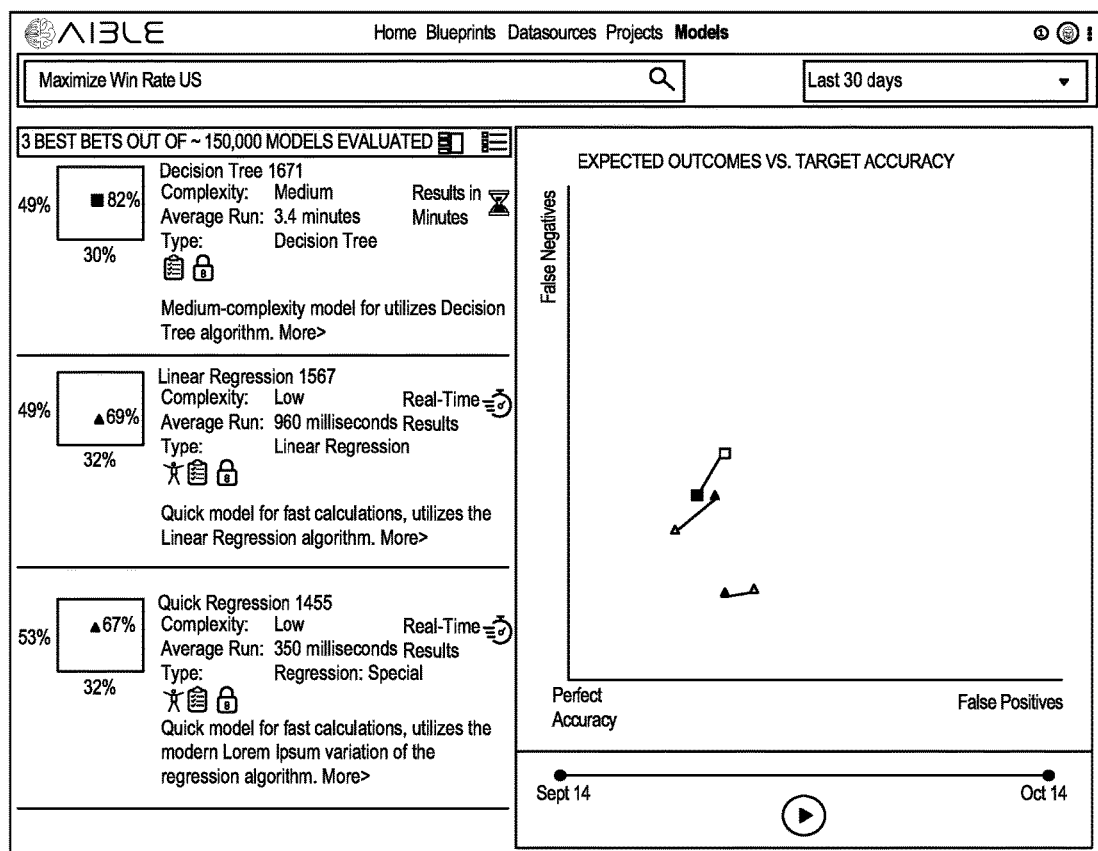
FIG. 7 is an example illustrating performance of three different models over time.

In some implementations, the performance of multiple models can be juxtaposed and assessed over time. FIG. 7 is an example illustrating performance of three different models over time. The performance over time of each model is represented by a worm block where the darker graphical object indicates the current or most recent performance while the lighter (e.g., gray) indicates historical performance. An interactive graphical control is included below the plot of false positives and false negatives and enables a user to move through time to assess performance and other characteristics of the models over time. By juxtaposing multiple models over time, improved analysis and understanding of the models can be provided. For example, the relative performance for several models developed for the same purpose can be evaluated for stability over time or an organization with many models deployed can track performance over time of all active models.

Figure 8:
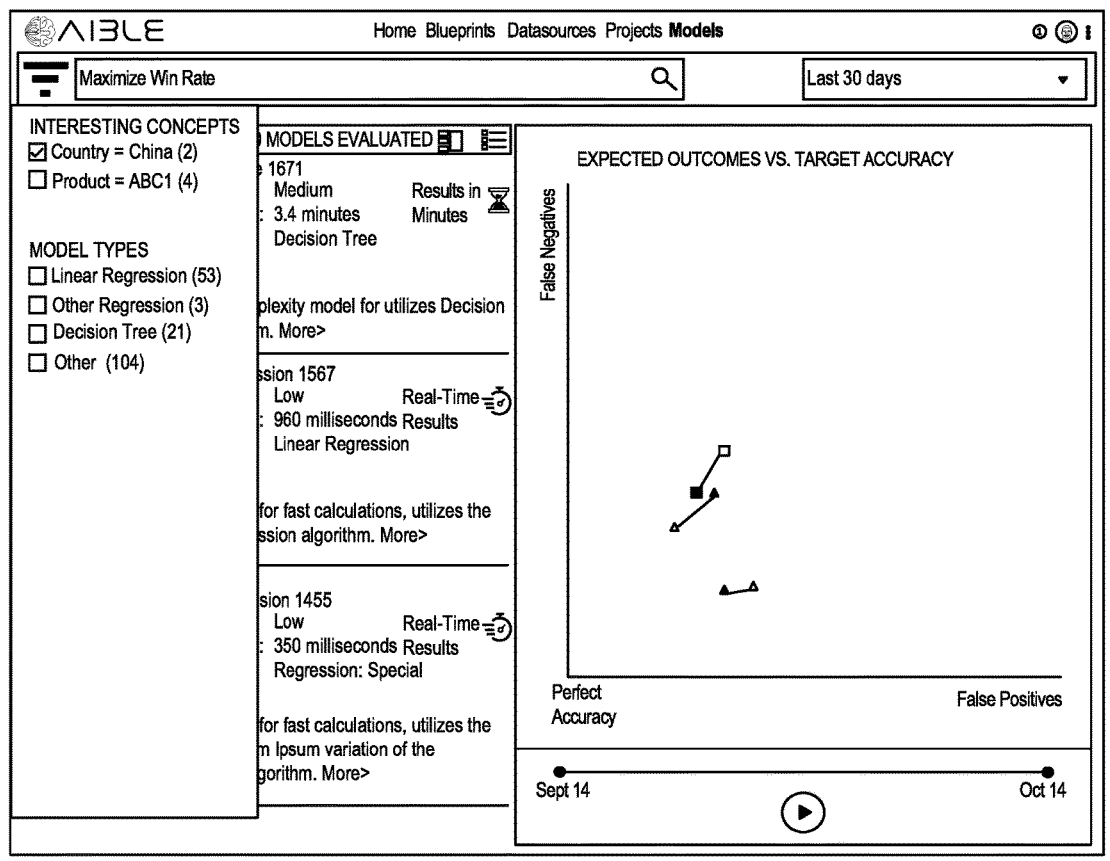
FIGS. 8-9 illustrate an example interface with models filtered by a data characteristic.
Figure 9:
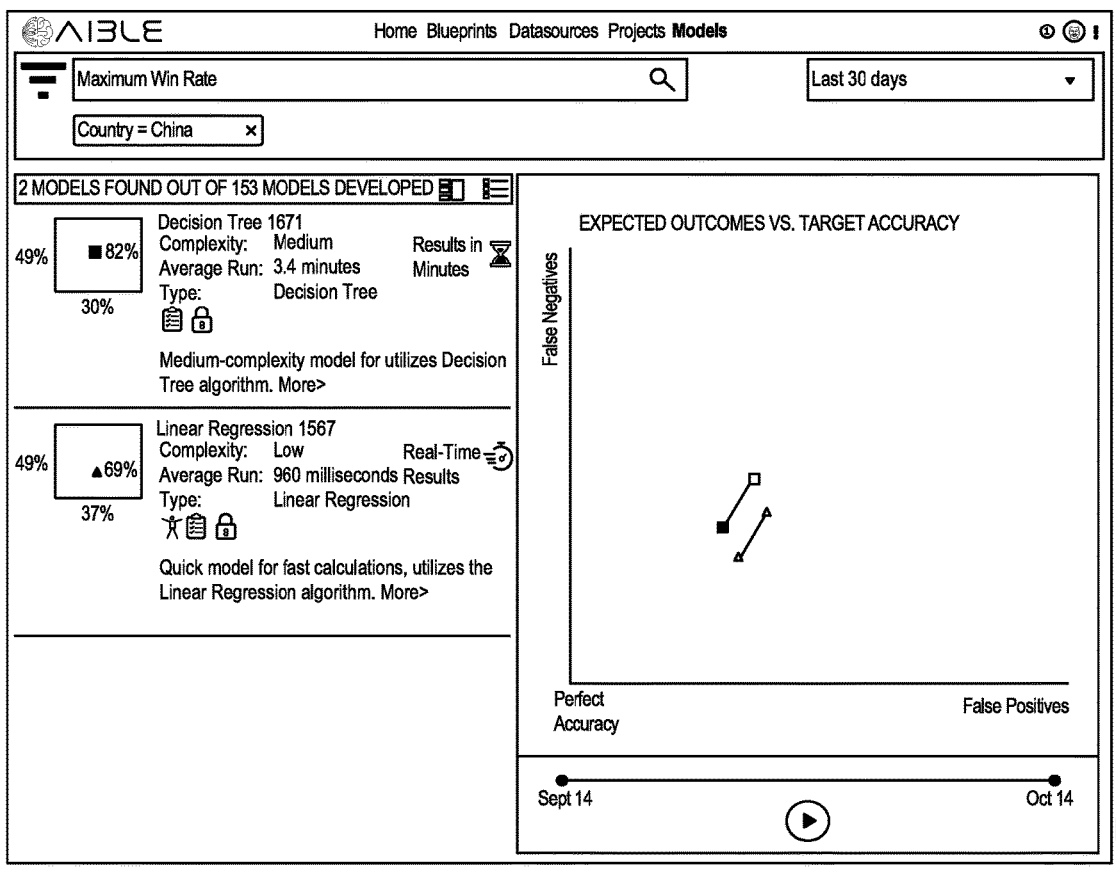

In some implementations, a single visualization can include multiple worm diagrams for respective data subgroups. For example, data can be grouped into subgroups and performance of a predictive model with respect to each subgroup can be shown as a worm diagram. Representing performance of data subgroups over time enables a user to identify a subgroup that is behaving poorly over time relative to other subgroups. In some implementations, the platform can automatically determine that a model can be improved and provide a recommendation to stratify or split a model based on the performance of subgroups of models. A model type to use with data associated with the subgroup subject to a split can be recommended. For example, FIGS. 8-9 illustrate an example interface with models filtered by a data characteristic.

In some implementations, the size of a graphical object or icon forming part of a worm diagram can indicate a relative proportion size of the data. The size of each bubble can be rescaled at each time point. In an alternate implementation, the size of the bullet indicates the growth rate of that subgroup. For example, in a current point in time, the graphical objects or icons forming parts of the worm diagram can rescale to the same size dots with the relative size of the next period dots indicating relative growth in size.

Some aspects of the current subject matter can include automatically generating blueprints or guides for a user by observing and modeling historical user behavior. The result can include an auto-generated blueprint that can guide a user, who may be inexperienced in certain types of data analysis, to perform advanced analysis. For example, business users typically don't know how to create a sales win/loss analysis. Some implementations of the current subject matter can learn, from user behavior that occurred during prior sales win/loss analysis, a blueprint for user action (e.g., best practices) to create a win/loss analysis. The blueprint can enable an interface to walk a user through creating an advanced scenario including identifying the appropriate variables, identifying the appropriate data sources (example data sources can be recommended), identifying the appropriate data granularity (e.g. whether each row should represent a customer or an opportunity), identifying specific data columns or rows to include or exclude, and the like. In some implementations, blueprints can be learned from identified enterprise integrations, including identifying appropriate data sets for a particular task.

Figure 11:
FIG. 11 illustrates an interface recommending customer information and customer revenue data, and the interface indicates locations that the respective types of data can be typically found.
Figure 12:
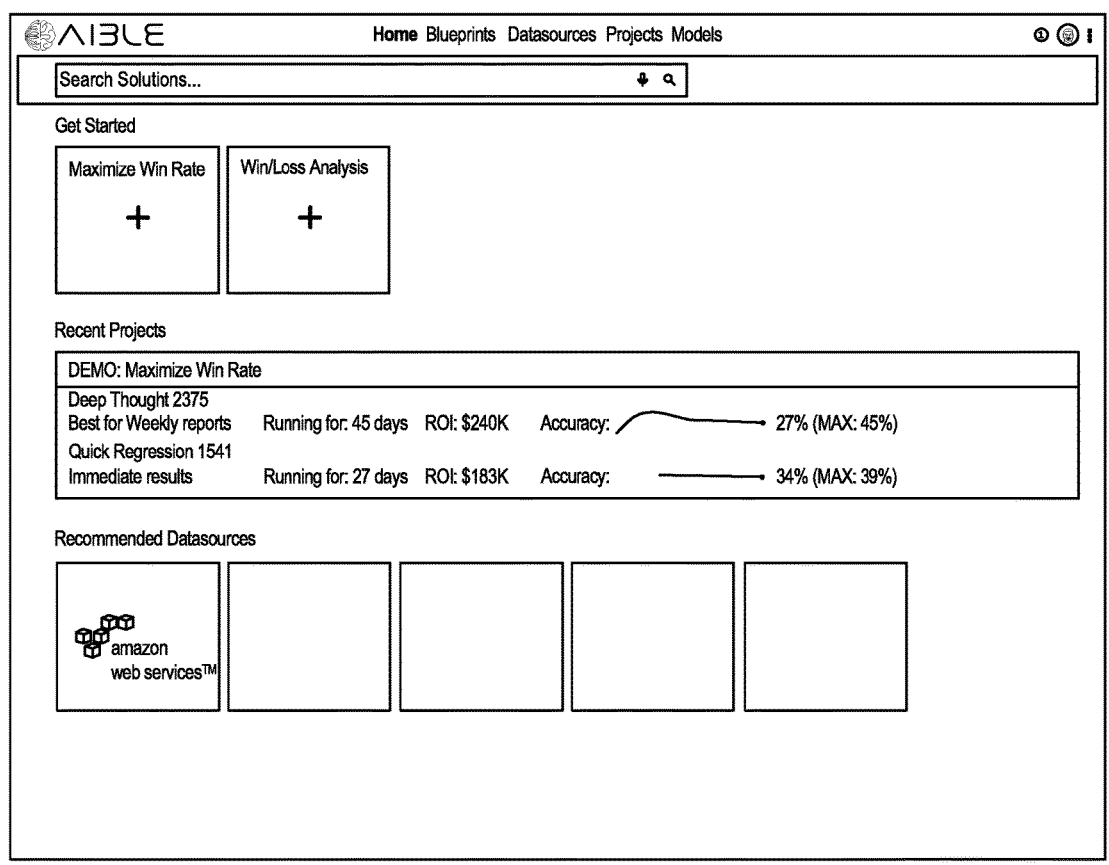
FIGS. 12-16 illustrate interfaces of an example platform according to an example implementation of the current subject matter.
Figure 13:
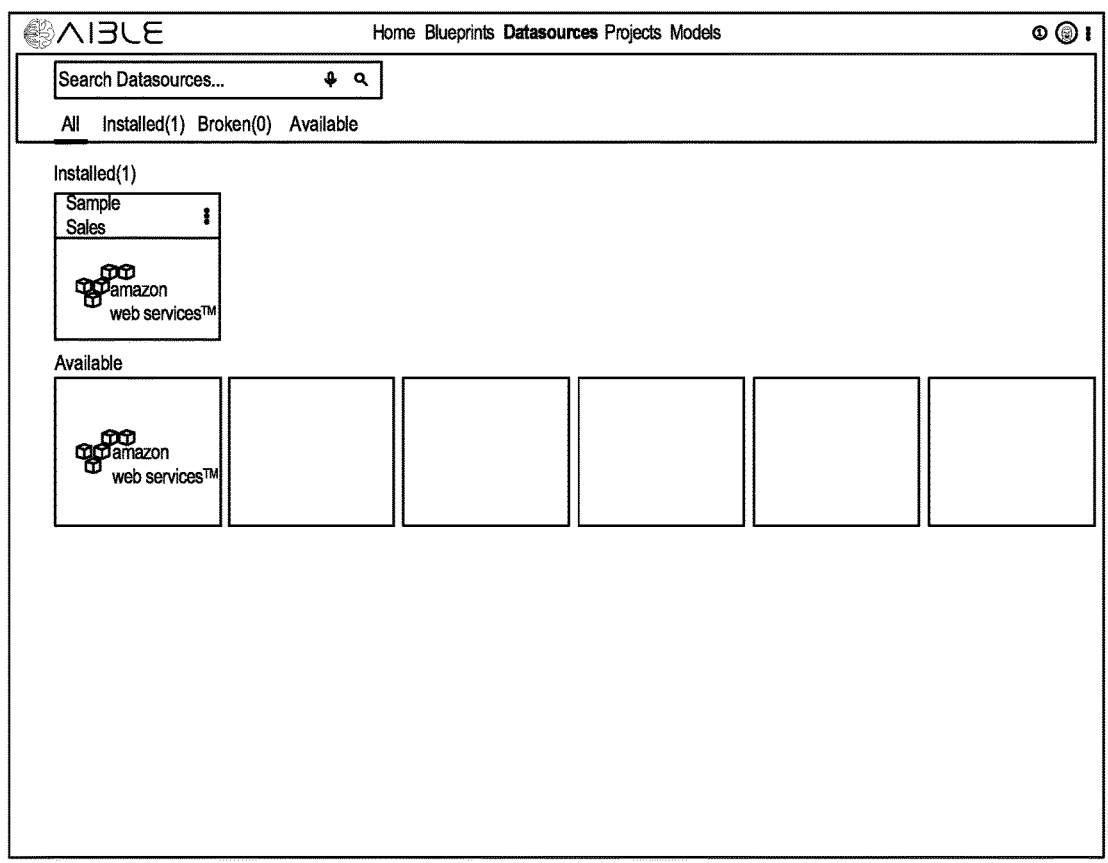
Figure 14:
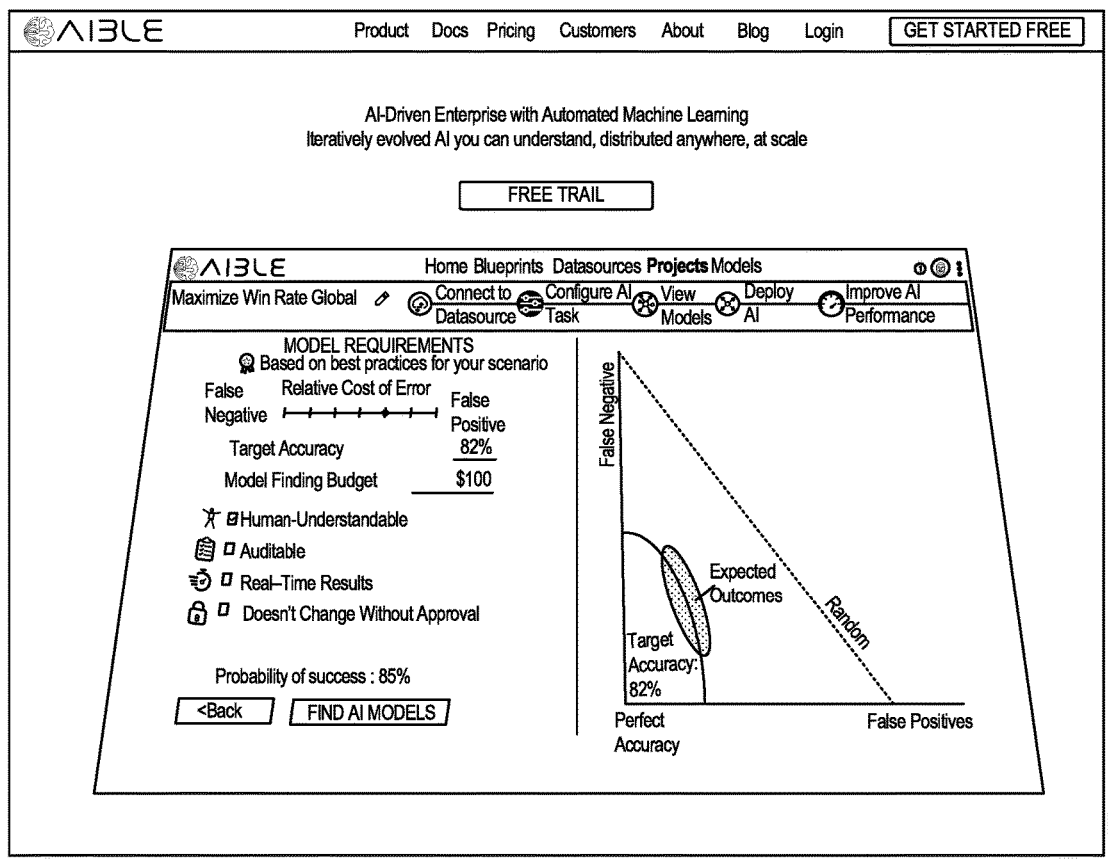
Figure 15:
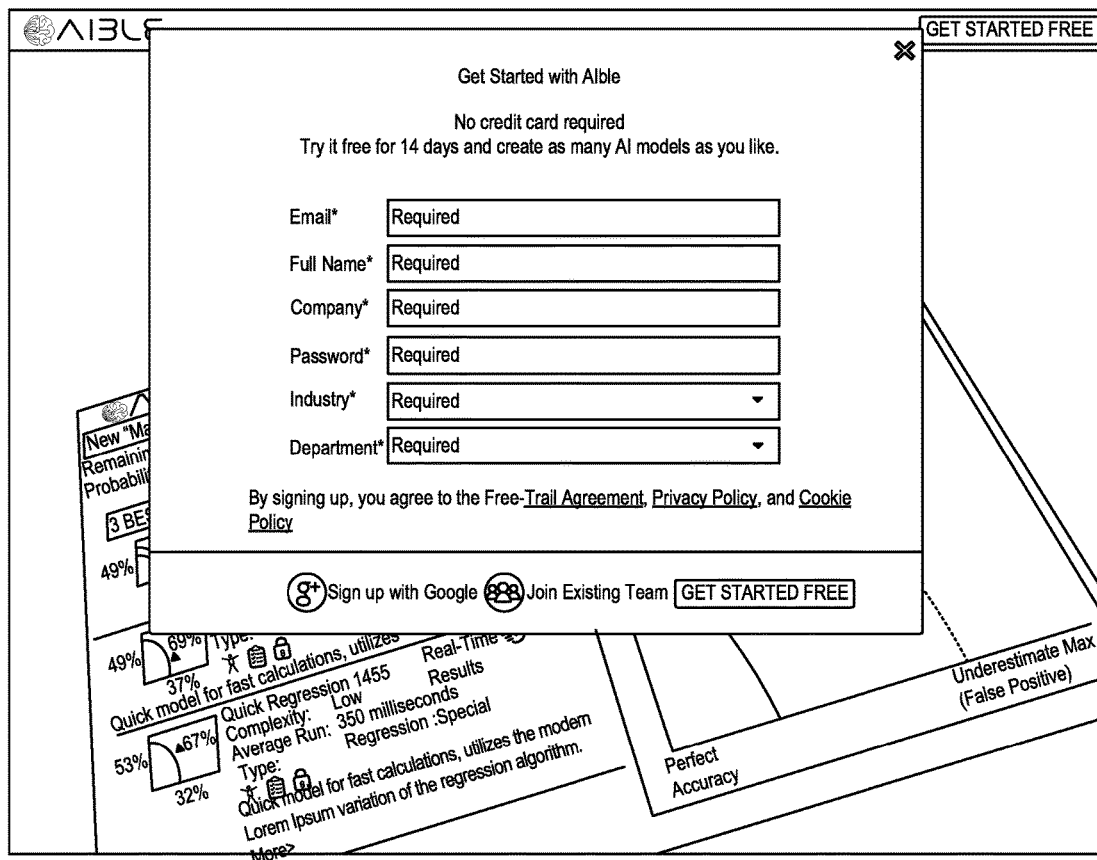
Figure 16:
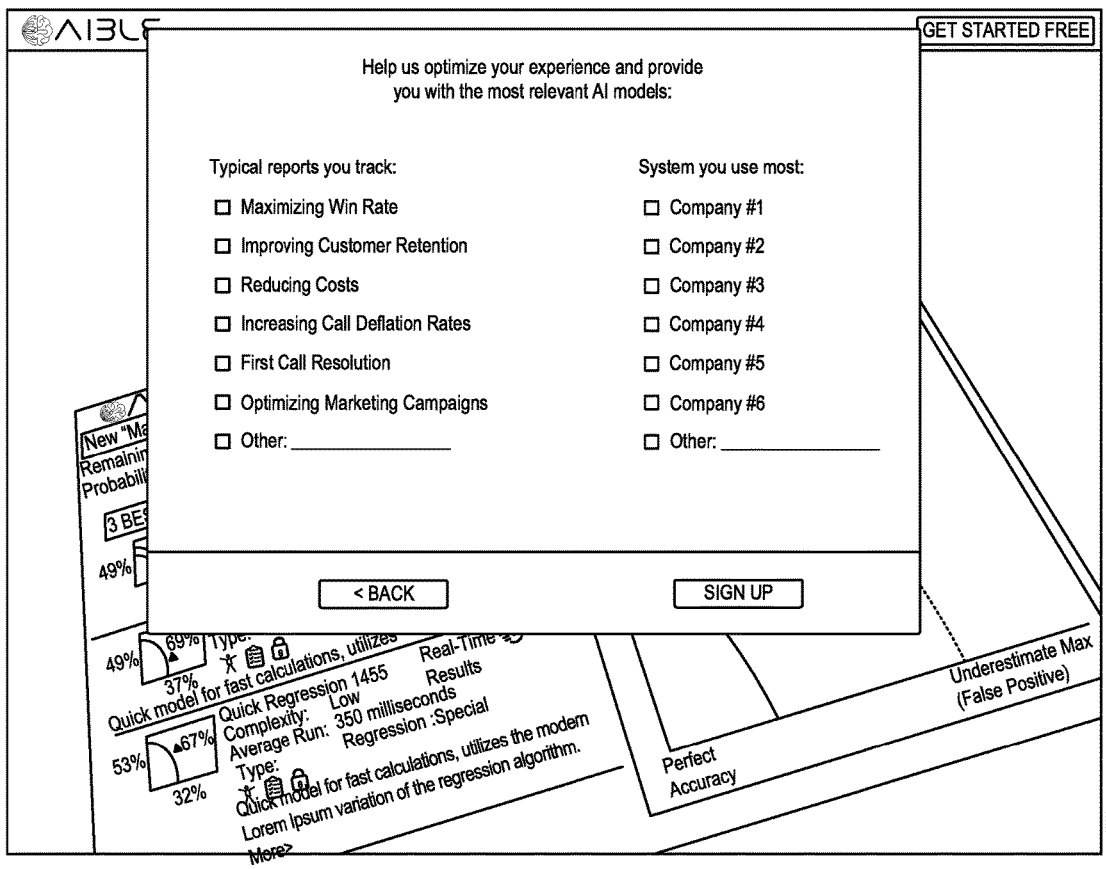
Figure 17:
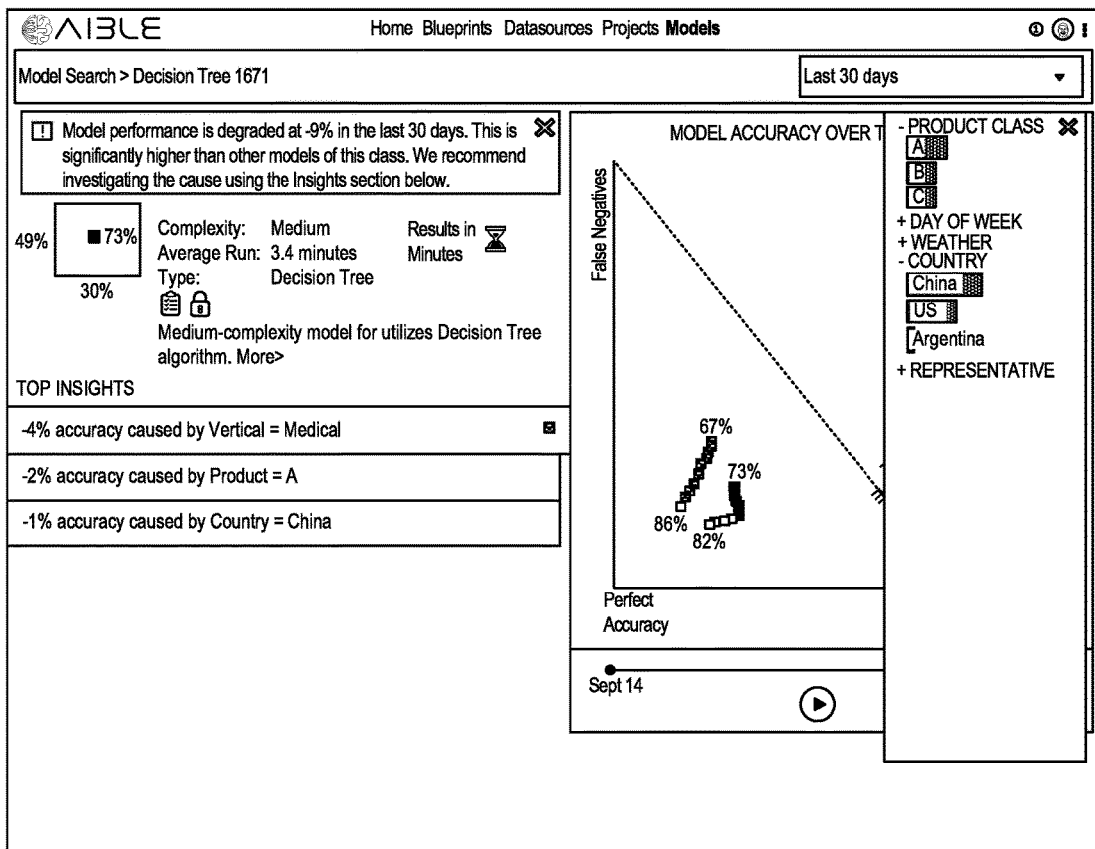
FIGS. 17-20 illustrate additional example interfaces that can enable a user to analyze the data subgroup performance.
Figure 18:
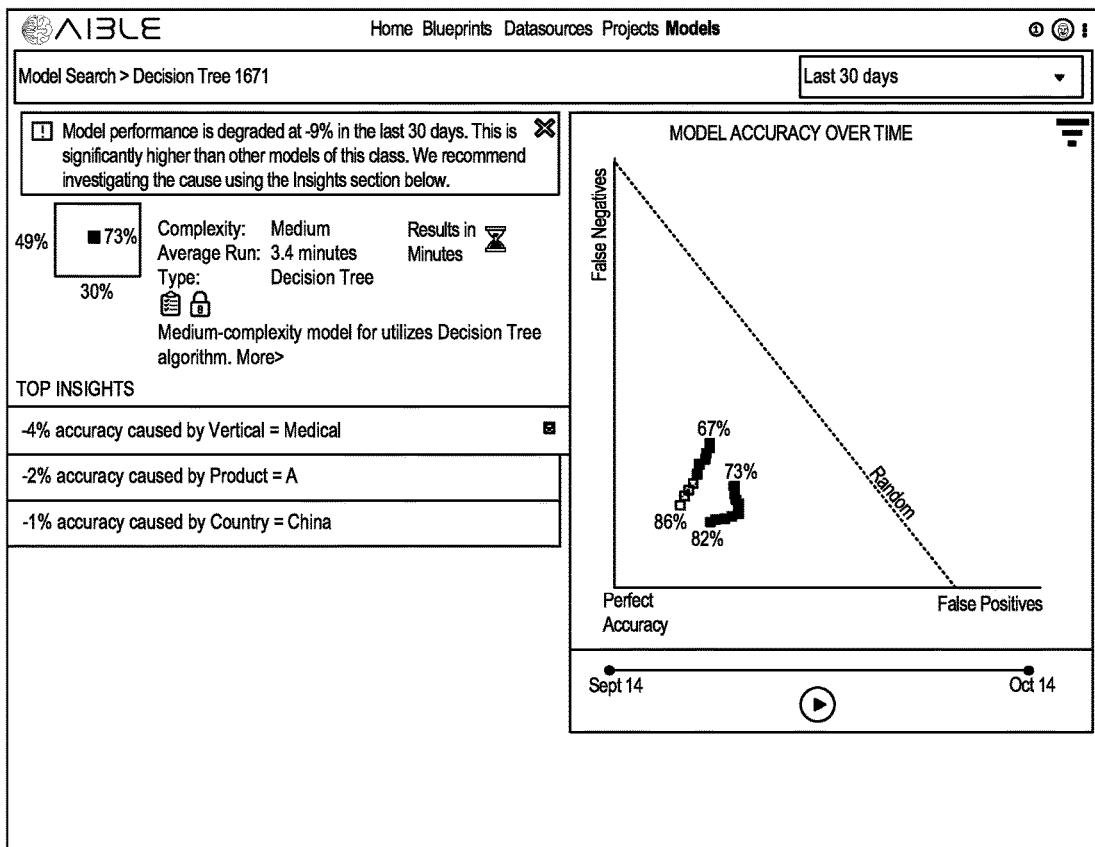
Figure 19:
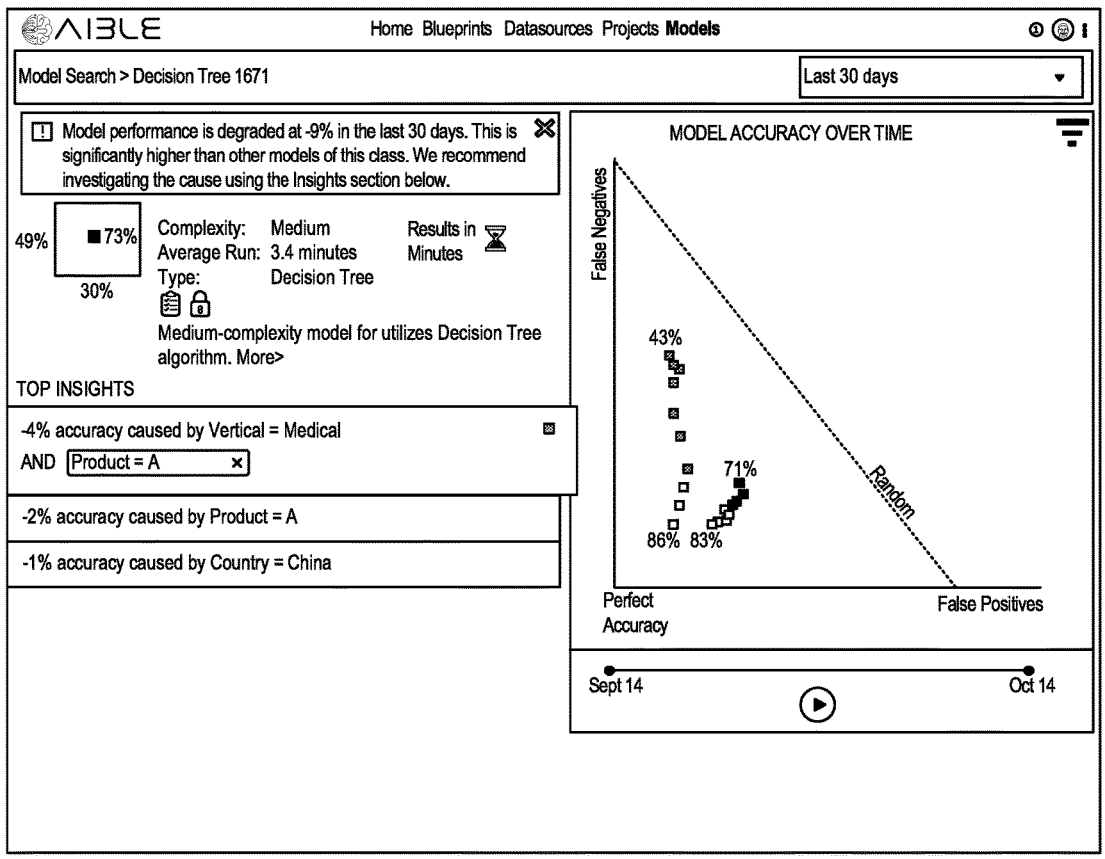
Figure 20:
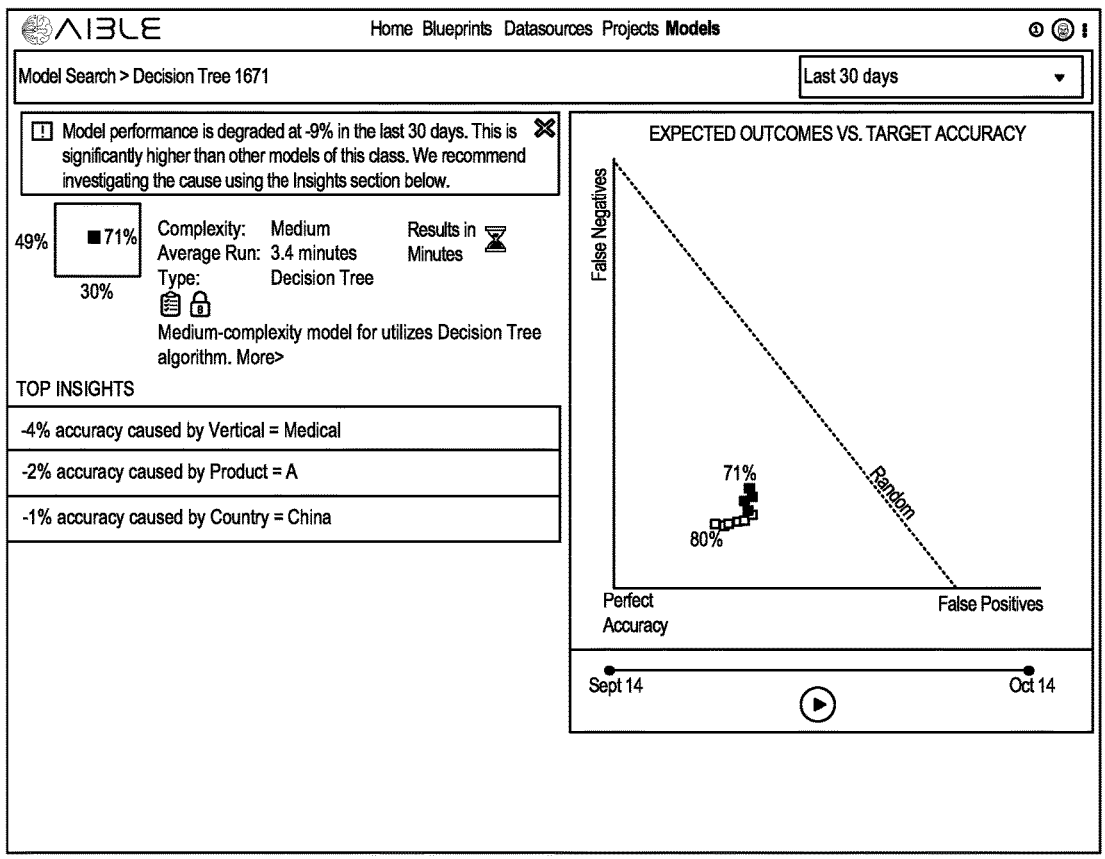
Figure 21:
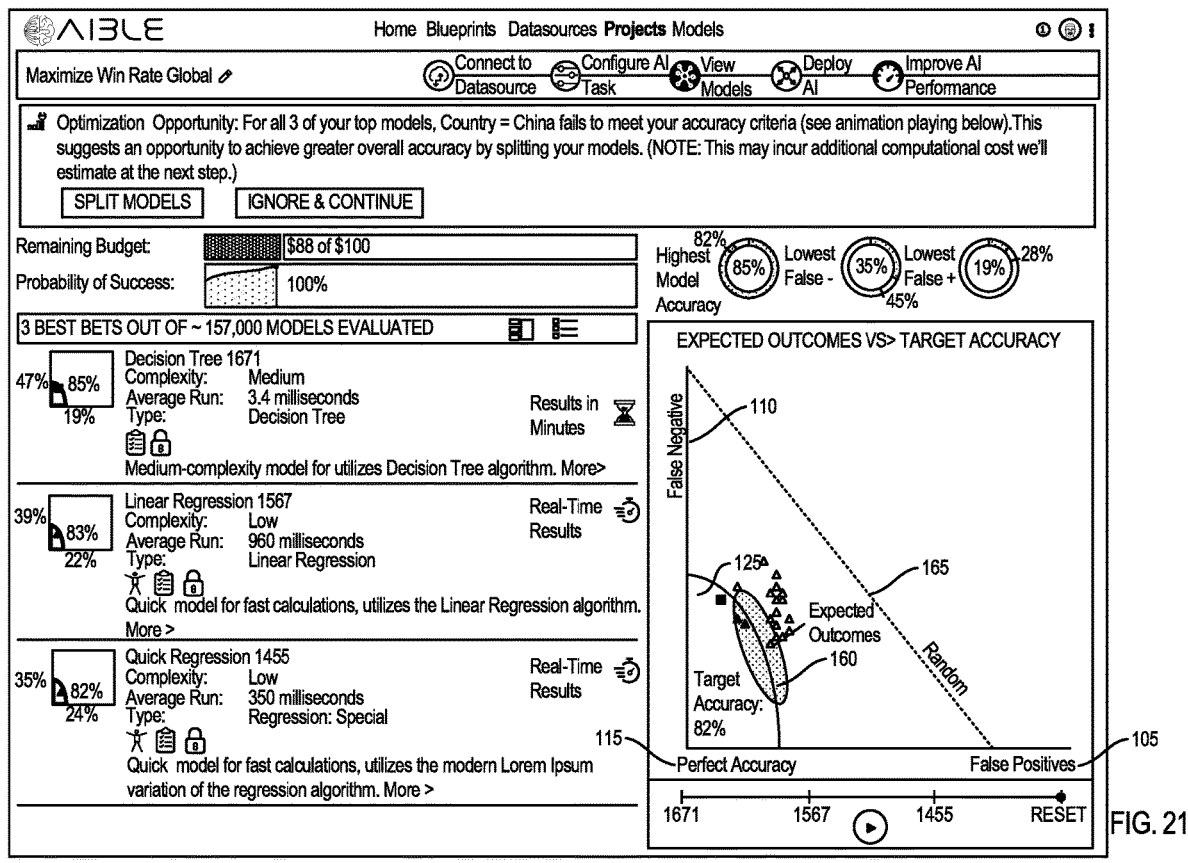
FIG. 21-24 illustrate additional example interfaces that can visualize outliers and provide a recommendation to take action to improve model performance.
Figure 22:
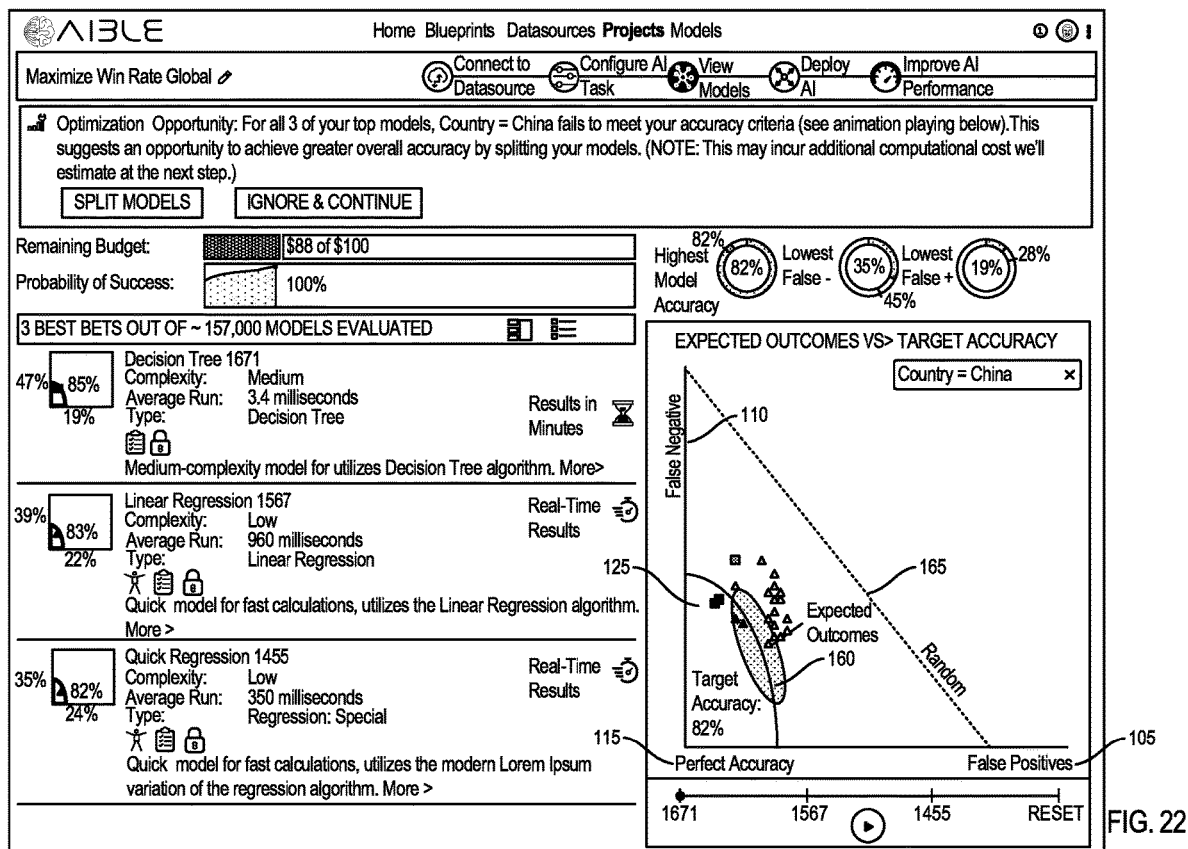
Figure 23:
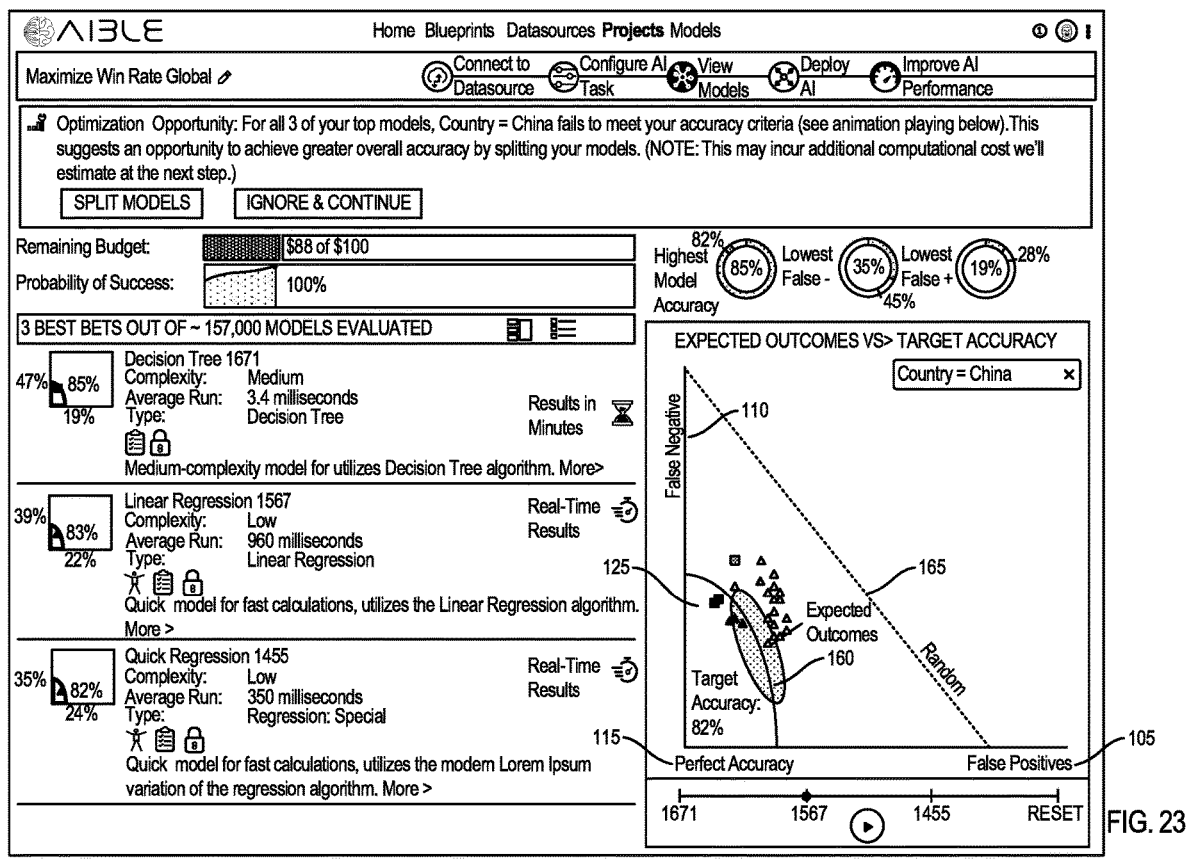
Figure 24:
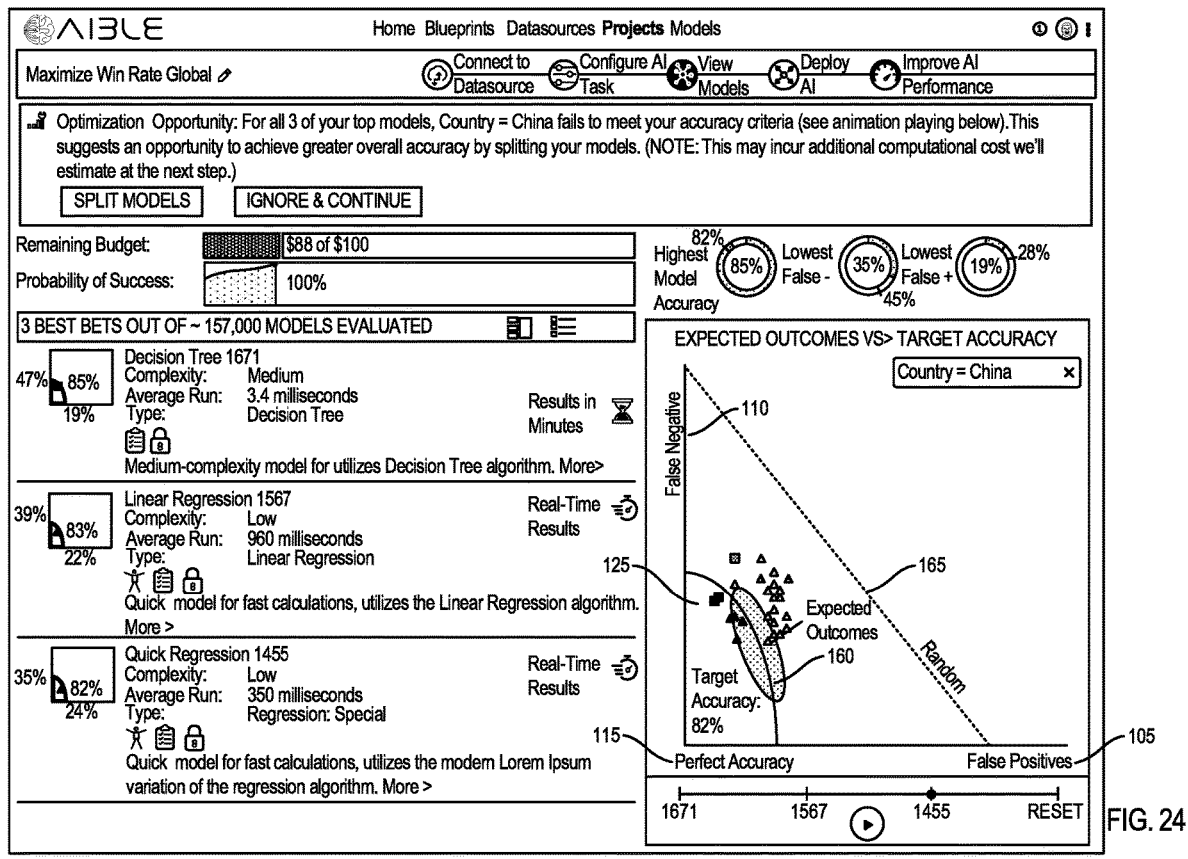

From FIG. 12 is an illustration of an example user interface for guiding a user through data analysis such as a win/loss analysis. Data that is typically used can be presented along with a link or description of a common source of the data. For example, in FIG. 11, customer information and customer revenue are recommended data, and the interface indicates locations that the respective types of data can be typically found.

The user may input additional information, which can be used for tailoring the interface and platform for the user including for use in predicting actions and providing recommendations for the user. Example interfaces of an example platform according to an implementation of the current subject matter is illustrated in FIGS. 12-16.

Figure 32:
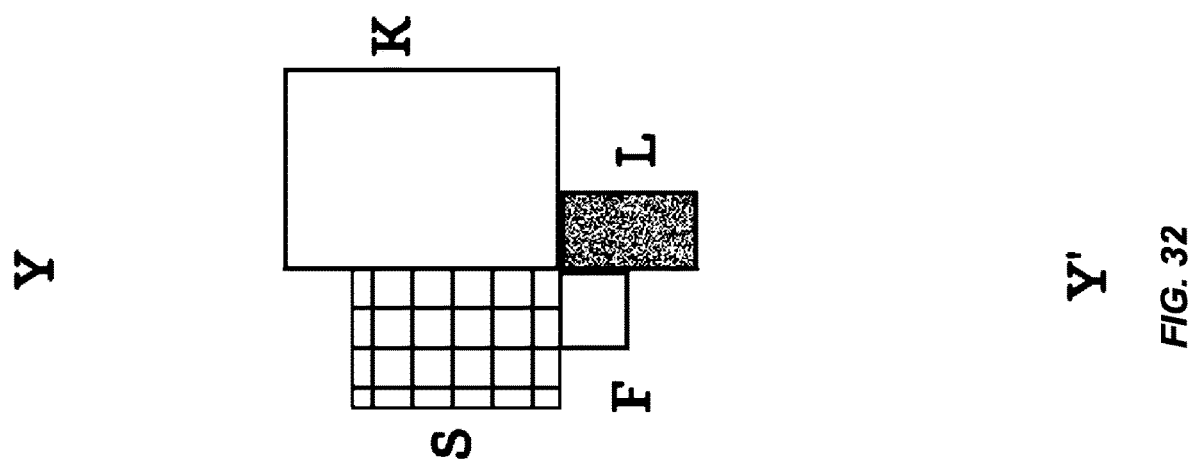
Figure 33:
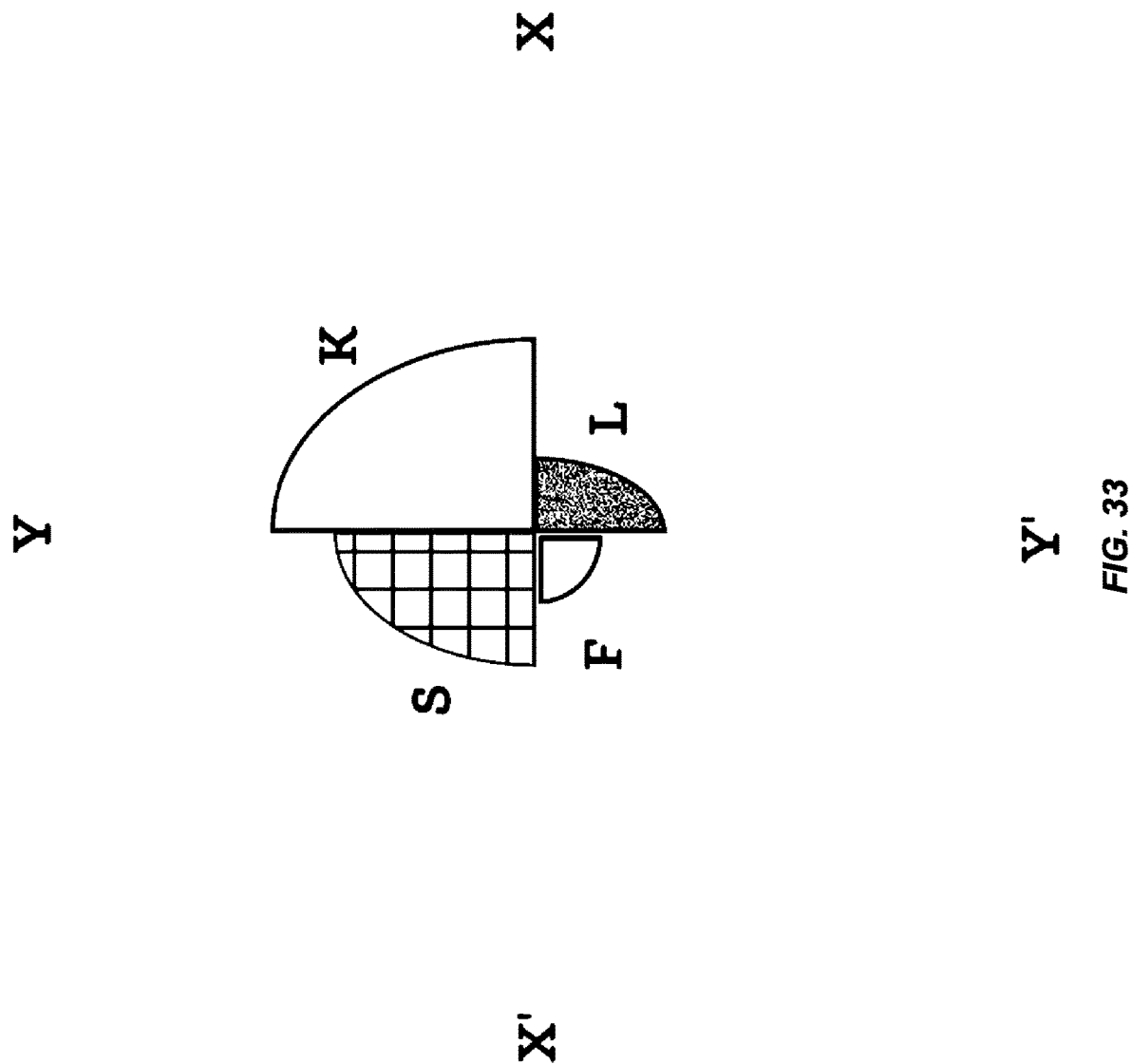

Confusion matrices are commonly used to convey model accuracy. a confusion matrix, also known as an error matrix, can include a specific table layout that allows visualization of the performance of an algorithm. Each row of the matrix can represent the instances in a predicted class while each column represents the instances in an actual class (or vice versa). The name stems from the fact that it makes it easy to see if the system is confusing two classes (e.g., commonly mislabeling one as another). In some implementations, adding physical scale to each area of a confusion matrix provides easier visual interpretability to traditional confusion matrices or can be used to show additional relevant dimensions (e.g. frequency, financial impact, and the like). Knowing the benefit of correct predictions, incorrect predictions, and the quantity of predictions over a given period, it can be possible to scale the areas to represent expected impact. By arranging the axes such that positive and negative outcomes are adjacent to each other, the visualization can provide a representation of the overall benefit of model accuracy. Adjustments can be provided to ensure the representation is consistent with actual data. For example, the ratio of actual outcomes can be adjusted to compensate for training data that is up sampled or down sampled, the count of records per period can also be adjusted to provide a more accurate estimate. For example, the training data may have 50% True and 50% False examples while the production data is expected to be 80% True and 20% False. In such a case, the weights for the confusion matrix can be updated to reflect the expected matrix when the model predicts based on the expected mix in production data. In FIG. 32, Y indicates correct prediction, Y' indicates incorrect prediction, X indicates positive outcome, X' indicates negative outcome. Thus, K relates to performance where the outcome is a correct prediction and positive outcome, S is a correct prediction and negative outcome, F is an incorrect prediction and negative outcome, and L is the incorrect prediction and positive outcome. The size of each region can be indicative of scale or of the relative benefits and costs. Another example visual is illustrated in FIG. 33

Running additional models to improve accuracy has a direct financial cost. Knowing the benefit of correct predictions, incorrect predictions, and the quantity of predictions over a given period, it is possible to determine the optimal tradeoff of accuracy to modeling cost. Using the accuracy tradeoff in conjunction with a prediction of potential accuracy improvement from additional modeling expenditures, it is possible to determine optimal model generation expenditure. Model generation can be paused when the optimal balance is achieved. This can be possible by detecting and predicting model convergence, the maximum accuracy possible in a given training dataset.

Monitoring and updating models used in production can be expensive. Models tend to degrade over time causing a negative impact on the target business outcome. Models are usually upgraded on a set schedule, or as model performance drops below a given threshold. Knowing the financial benefit of correct predictions, incorrect predictions, and the quantity of predictions over a given period, the cost of model degradation can be determined. As with initial model development, using the accuracy tradeoff in conjunction with a prediction of potential accuracy improvement from additional modeling expenditures, it can be possible to determine the optimal model update expenditure to maximize overall profitability. This can be applied to model maintenance to inform users when the financial threshold for updating the model has been reached.

Figure 34:
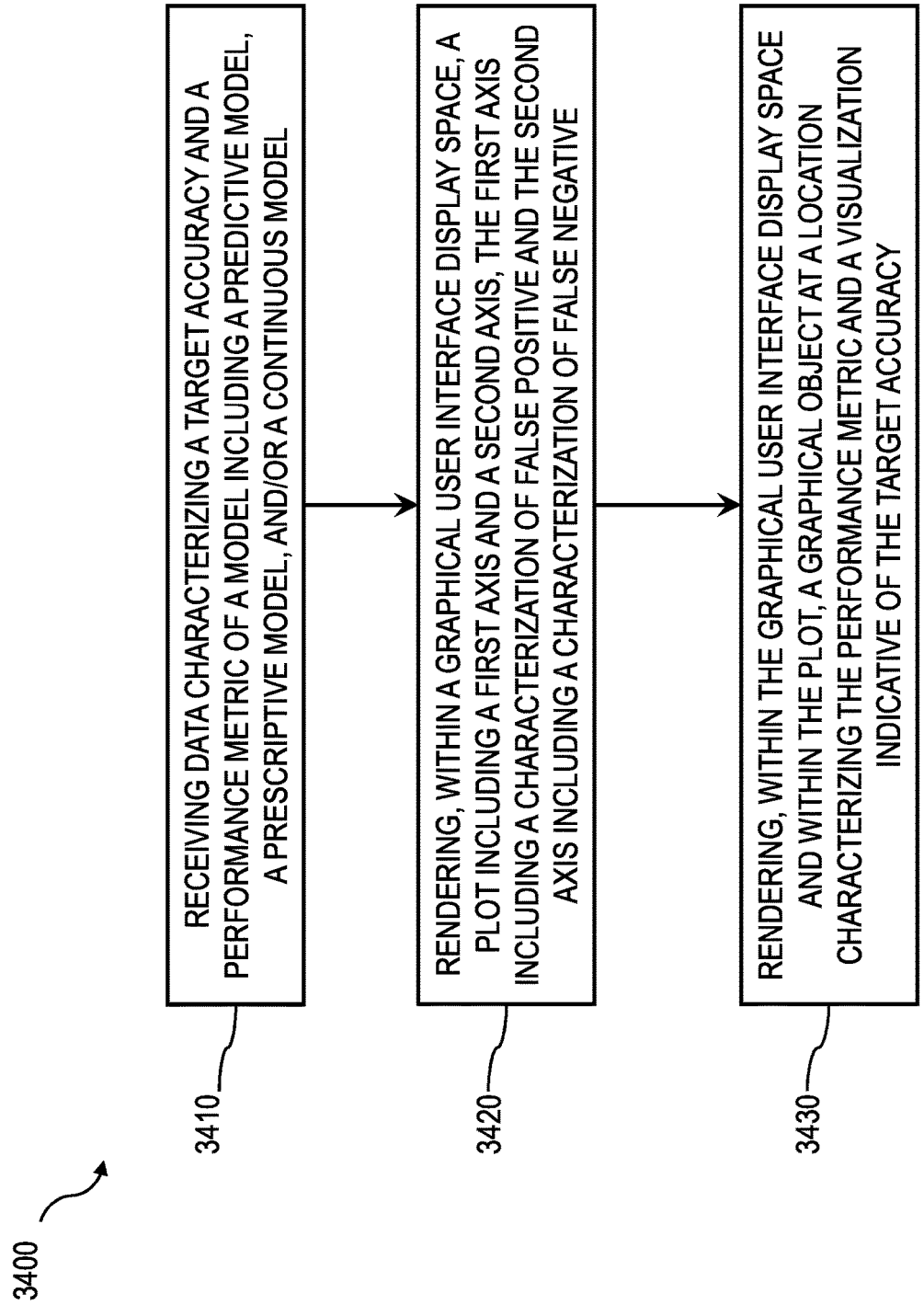
FIG. 34 is a process flow diagram illustrating an example process enabling an improved interface that can enable deeper understanding of a model's performance.

FIG. 34 is a process flow diagram illustrating an example process 3400 enabling an improved interface that can enable deeper understanding of a model's performance.

At 3410, data is received characterizing a target accuracy and a performance metric of a model. The model can include classifiers, predictors, and/or prescriptive models (e.g., a predictive model, a prescriptive model, and/or a continuous model).

At 3420, a plot can be rendered within a graphical user interface display space. The plot can include a first axis and a second axis. The first axis can include a characterization of false positive and the second axis including a characterization of false negative. In some implementations, the characterization of rate of false positive can include rate of false positive, count of false positive, cost of false positive, benefit missed by false positive, true positive, benefit of true positive, benefit of minimizing false positive, or benefit of maximizing true positive. The characterization of rate of false negative can include rate of false negative, cost of false negative, count of false negative, benefit missed by false negative, true negative, benefit of true negative, benefit of minimizing false negative, or benefit of maximizing true negative.

At 3430, a graphical object can be rendered within the graphical user interface display space and within the plot. The graphical object can be rendered at a location characterizing the performance metric. A visualization indicative of the target accuracy can be rendered. In some implementations, a region indicative of the target accuracy can be rendered. The region can be indicative of the target accuracy and can be bounded by at least: a first line indicative of the target accuracy and an origin of the plot; the second line indicative of constant accuracy and the origin; or the second line indicative of constant accuracy, the third line indicative of constant cost, and the origin.

In some implementations, a second line indicative of constant accuracy can be rendered and a third line indicative of constant cost can be rendered.

In some implementations, a balance metric characterizing a relative proportion of observed classes within a dataset can be determined. The line indicative of the target accuracy can include a curved line, a degree of curvature of the line indicative of the target accuracy based on the determined balance metric. User input characterizing a relative cost of false negative and relative cost of false positive can be received. A line indicative of constant cost weighted according to the received user input can be rendered.

In some implementations, data characterizing a second performance metric of a second model can be received. A second graphical object at a second location characterizing the second performance metric can be rendered within the graphical user interface display space and within the plot.

The graphical object can include a shape and/or color indicative of a characteristic of the model, the characteristic including a complexity metric. The performance metric of the model can include a first rate of false positive value and a first rate of false negative value. The location of the graphical object with respect to the first axis can be indicative of first false positive rate value and the location of the graphical object with respect to the second axis is indicative of the first false negative rate value.

In some implementations, a first interactive graphical object characterizing a first input value of a model generator can be rendered in the graphical user interface display space. User interaction with the first interactive graphical object and indicative of the first input value can be received. One or more candidate models can be determined based on the received data characterizing user interaction with the first interactive graphical object. A second graphical object indicative of the one or more candidate models can be rendered. User input specifying the target accuracy, a relative cost of error, model requirements, and a budget for model development can be received. A probability of developing a predictive model according to the target accuracy, the relative cost of error, the model requirements, and the budget for model development can be determined. A visualization characterizing the probability can be rendered within the graphical user interface display space. A range of expected outcomes can be determined using a predictive model trained on observations of users developing models. The observations can include characteristics of training datasets, selected model requirements, selected model development budgets, and performance of models generated. A second region indicative of the determined range of expected outcomes can be rendered within the plot.

User input specifying the target accuracy, a relative cost of error, model requirements, and a budget for model development can be received. Training of a first candidate model can be caused based at least on the received user input specifying the relative cost of error, the model requirements, and the budget for model development. A performance metric of the first candidate model can be determined. A second graphical object at a location characterizing the performance metric of the first candidate model can be rendered within the graphical user interface display space and within the plot.

Figure 36:
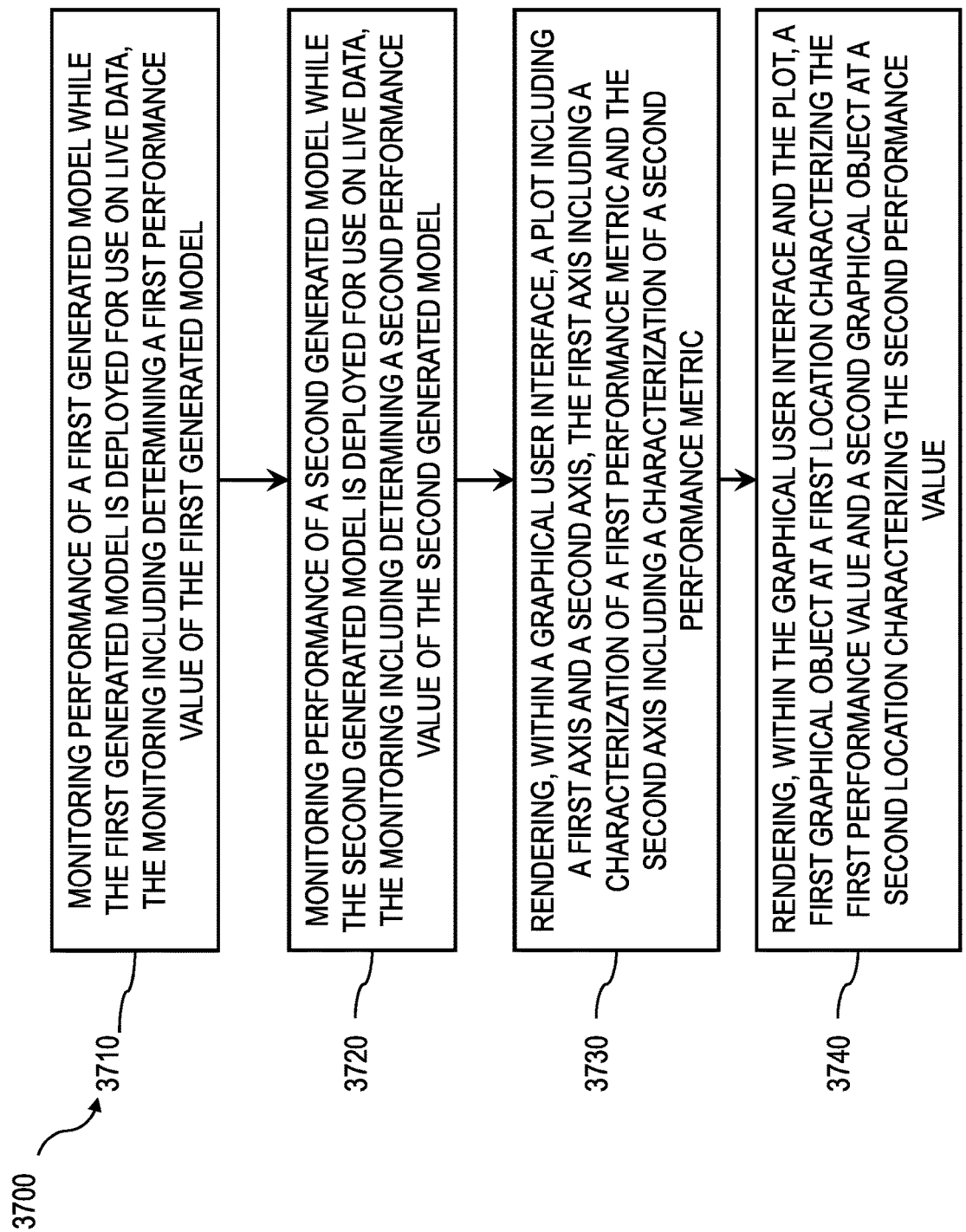
FIG. 36 is a process flow diagram illustrating an example process of monitoring deployed models and assessing their performance.

FIG. 36 is a process flow diagram illustrating an example process 3600 enabling an improved interface that can enable deeper understanding of a model's performance. At 3710, performance of a first generated model can be monitored while the first generated model is deployed for use on live data. The monitoring can include determining a first performance value of the first generated model. In some implementations, the first performance value includes a count of a positive outcome or a count of a negative outcome. The first performance value can include a count of a correct prediction or an incorrect prediction. The first generated model can have been trained on historical data.

At 3720, performance of a second generated model can be monitored while the second generated model is deployed for use on live data. The monitoring can include determining a second performance value of the second generated model.

At 3730, a plot including a first axis and a second axis can be rendered within a graphical user interface. The first axis can include a characterization of a first performance metric and the second axis including a characterization of a second performance metric. In some implementations, the first axis is indicative of a positive or a negative outcome; and wherein the second axis is indicative of a correct or incorrect prediction.

At 3740 a first graphical object can be rendered within the graphical user interface at a first location characterizing the first performance value and a second graphical object can be rendered at a second location characterizing the second performance value. In some implementations, the size of the first graphical object is indicative of a scale of the first performance value. In some implementations, a size of the first graphical object is indicative of a relative cost or a relative benefit.

In some implementations, a ratio of outcomes can be adjusted according to a count of records per period.

In some implementations, future cost or net benefit of the first deployed model over time can be determined. A characterization of the future cost or net benefit of the first deployed model over time can be rendered within the graphical user interface.

In some implementations, the first generated model can have been trained on historical data and each transaction in the live data can include an associated characteristic. Future cost or net benefit of the first deployed model can be determined based on a change in distribution of transaction characteristics of the data source of the first model and over time. The associated characteristic can characterize a specific subgroup of the population. The specific subgroup can include a geographic location associated with a respective transaction, a component failure, a capacity measure, and the like. A distribution of transaction characteristics of the live data can be different than a training distribution of transaction characteristics of the historical data.

In some implementations, subgroups of the live data can be identified within the live data. A performance metric for the first generated model and for each of the subgroups of the live data and over time can be determined. A characterization of the determined performance metric for each of the subgroups can be rendered within the graphical user interface. The characterization of the determined performance metric can indicate a relative proportion size of a respective subgroup of the live data.

In some implementations, the first performance metric can include rate of false positive, count of false positive, cost of false positive, cost of overestimate, cost of underestimate, benefit missed by false positive, true positive, benefit of true positive, benefit of minimizing false positive, benefit of maximizing true positive, or a combination thereof. The second performance metric can include rate of false negative, count of false negative, cost of false negative, benefit missed by false negative, true negative, benefit of true negative, benefit of minimizing false negative, benefit of maximizing true negative, or a combination thereof.

In some implementations, a third generated model can be monitored where the monitoring can include determining a third performance value. A third graphical object can be rendered within a graphical user interface at a third location characterizing the third performance value.

Figure 37:
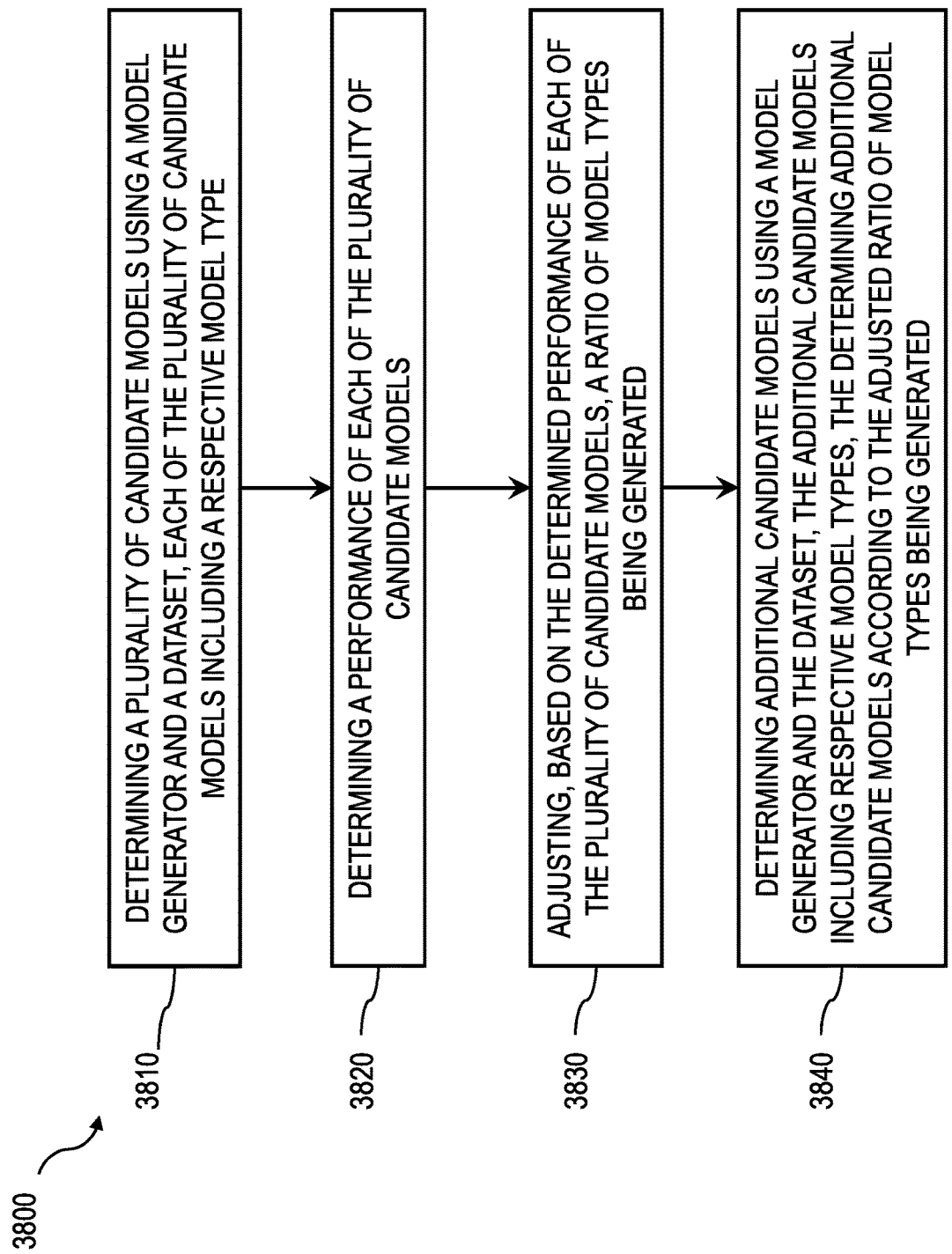
FIG. 37 is a process flow diagram illustrating an example process according to an example implementation of some aspects of the current subject matter that can adjust model types that are being generated in response to a performance of previously generated candidate models.

FIG. 37 is a process flow diagram illustrating an example process 3800 according to an example implementation of some aspects of the current subject matter that can adjust model types that are being generated in response to a performance of previously generated candidate models.

At 3810, a plurality of candidate models can be determined using a model generator and a dataset, each of the plurality of candidate models including a respective model type. In some implementations, each respective model type is one of a set of model types.

At 3820, a performance of each of the plurality of candidate models can be determined.

At 3830, a ratio of model types being generated can be adjusted based on the determined performance of each of the plurality of candidate models.

At 3840, additional candidate models can be determined using a model generator and the dataset. The additional candidate models can include respective model types. The determining additional candidate models can be according to the adjusted ratio of model types being generated.

In some implementations, data characterizing an objective can be received. The adjusting can be further based on the received objective. One or more models from the plurality of candidate models can be identified based on the determined performance. Data characterizing the determined performance of the identified one or more models can be displayed in a graphical user interface. The determining the plurality of candidate models can be according to an initial ratio determined from historic performance of similar data sets.

The subject matter described herein provides many technical advantages. For example, users are often unable to interpret the meaning of overall accuracy and can deploy models unaware that even a model with an apparently high accuracy percentage could underperform random selection, the current subject matter can provide context to clearly identify relative performance. By providing a relative cost tradeoff, users may not need to know the exact values of false positives to false negatives, they simply can understand the relative cost of one to the other to develop a cost optimized target. By developing a target prior to model development, there can be a clear business driven success criteria, which can prevent spending additional time and resources driving for ever high performance. Automatically pausing additional model runs when a goal is achieved, or the probability of a successful outcome drops below a certain threshold, allows users to start an analysis with low risk of wasting their specified budget. Identifying subgroups where models are underperforming, performing suspiciously well, or responding differently to certain model types can provide valuable information to assist in improving future models with far less effort than would be needed traditionally to identify similar information. Blueprints highlighting data that is likely useful and where it usually resides can allow users to identify and locate additional information that they might not have initially considered. The range of expected outcomes can provide calibration before an analysis is run by providing the performance of similar analyses and provide a realistic probability of achieving the desired performance. The range of expected outcomes can also provide feedback as results from model runs begin to appear by showing if results are underperforming expectation or are perhaps too good to be true. Deployed models can typically require extensive monitoring, or frequent updates, to make sure they continue to meet the desired performance objectives, which can prove costly. Providing a single graph identifying all models deployed in an organization with the degradation over time, organizations can focus on updating only the models that have degraded enough to require action, and the performance is far easier to monitor and understand the shifts over time. This tracking over time also can make it easy to identify where a model is degrading by identifying areas of underperformance and showing the change of identified subgroups relative to all other groups over time.

Figure 35:
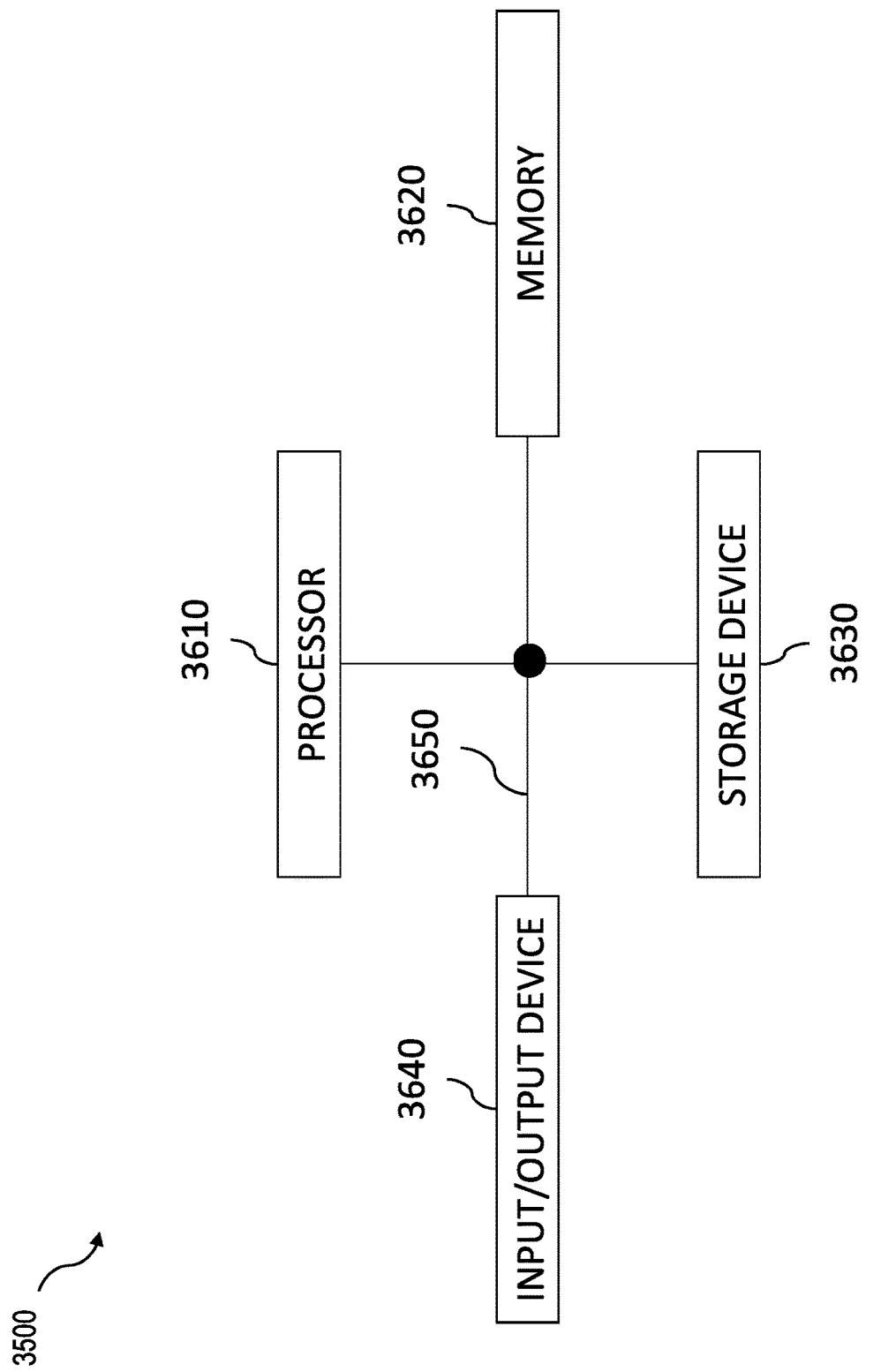
FIG. 35 is a system block diagram illustrating an example implementation according to some aspects of the current subject matter.

In some implementations, the current subject matter can be configured to be implemented in a system 3500, as shown in FIG. 35. The system 3500 can include one or more of a processor 3610, a memory 3620, a storage device 3630, and an input/output device 3640. Each of the components 3610, 3620, 3630 and 3640 can be interconnected using a system bus 3650. The processor 3610 can be configured to process instructions for execution within the system 3600. In some implementations, the processor 3610 can be a single-threaded processor. In alternate implementations, the processor 3610 can be a multi-threaded processor. The processor 3610 can be further configured to process instructions stored in the memory 3620 or on the storage device 3630, including receiving or sending information through the input/output device 3640. The memory 3620 can store information within the system 3600. In some implementations, the memory 3620 can be a computer-readable medium. In alternate implementations, the memory 3620 can be a volatile memory unit. In yet some implementations, the memory 3620 can be a non-volatile memory unit. The storage device 3630 can be capable of providing mass storage for the system 3600. In some implementations, the storage device 3630 can be a computer-readable medium. In alternate implementations, the storage device 3630 can be a hard disk device, an optical disk device, a tape device, non-volatile solid state memory, or any other type of storage device. The input/output device 3640 can be configured to provide input/output operations for the system 3600. In some implementations, the input/output device 3640 can include a keyboard and/or pointing device. In alternate implementations, the input/output device 3640 can include a display unit for displaying graphical user interfaces.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including acoustic, speech, or tactile input. Other possible input devices include touch screens or other touch-sensitive devices such as single or multi-point resistive or capacitive trackpads, voice recognition hardware and software, optical scanners, optical pointers, digital image capture devices and associated interpretation software, and the like.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A method comprising:
monitoring performance of a first generated model while the first generated model is deployed for use on live data, the monitoring including determining a first performance value of the first generated model;
monitoring performance of a second generated model while the second generated model is deployed for use on live data, the monitoring including determining a second performance value of the second generated model;
rendering, within a graphical user interface, a plot including a first axis and a second axis, the first axis including a characterization of a first performance metric and the second axis including a characterization of a second performance metric; and
rendering, within the graphical user interface and the plot, a first graphical object at a first location characterizing the first performance value and a second graphical object at a second location characterizing the second performance value;
wherein the first generated model has been trained on historical data and wherein each transaction in the live data includes an associated characteristic, wherein a distribution of transaction characteristics of the live data is different than a distribution of transaction characteristics of the historical data.

2. The method of claim 1, wherein the first axis is indicative of a positive or a negative outcome; and wherein the second axis is indicative of a correct or incorrect prediction.

3. The method of claim 2, wherein a size of the first graphical object is indicative of a scale of the first performance value.

4. The method of claim 2, wherein a size of the first graphical object is indicative of a relative cost or a relative benefit.

5. The method of claim 1, wherein the first performance value includes a count of a positive outcome or a count of a negative outcome, the first performance value further includes a count of a correct prediction or an incorrect prediction, the method further comprising:
adjusting a ratio of outcomes according to a count of records per period.

6. The method of claim 1, further comprising:
determining future cost or net benefit of the first deployed model over time.

7. The method of claim 6, further comprising:
rendering, within the graphical user interface, a characterization of the future cost or net benefit of the first deployed model over time.

8. The method of claim 1, further comprising:
determining future cost or net benefit of the first deployed model based on a change in distribution of transaction characteristics of the data source of the first model and over time.

9. The method of claim 8, wherein the associated characteristic characterizes a specific subgroup of the population, the specific subgroup including a geographic location associated with a respective transaction, a component failure, or a capacity measure.

10. The method of claim 1, the method further comprising:
identifying, within the live data, subgroups of the live data;
determining a performance metric for the first generated model and for each of the subgroups of the live data and over time; and
rendering, within the graphical user interface, a characterization of the determined performance metric for each of the subgroups, wherein the characterization of the determined performance metric indicates a relative proportion size of a respective subgroup of the live data.

11. The method of claim 1, wherein the first performance metric includes rate of false positive, count of false positive, cost of false positive, cost of overestimate, cost of underestimate, benefit missed by false positive, true positive, benefit of true positive, benefit of minimizing false positive, benefit of maximizing true positive, or a combination thereof;
wherein the second performance metric includes rate of false negative, count of false negative, cost of false negative, benefit missed by false negative, true negative, benefit of true negative, benefit of minimizing false negative, benefit of maximizing true negative, or a combination thereof.

12. The method of claim 1, further comprising:
monitoring a third generated model, the monitoring including determining a third performance value; and
rendering, within the graphical user interface and the plot, a third graphical object at a third location characterizing the third performance value.

13. A method comprising:
training, according to a value characterizing a relative proportion of model types to train, a plurality of candidate models using a model generator and a dataset, each of the plurality of candidate models including a respective model type, the respective model types including at least a first model type and a second model type;
determining a performance of each of the plurality of candidate models;
adjusting, based on the determined performance of each of the plurality of candidate models, the value characterizing the relative proportion of model types to train; and
training, according to the adjusted value characterizing relative proportion of model types to train, additional candidate models using the model generator and the dataset, the additional candidate models including respective model types.

14. The method of claim 13, wherein each respective model type is one of a set of model types.

15. The method of claim 13, further comprising:
receiving data characterizing an objective;
wherein the adjusting is further based on the received objective.

16. The method of claim 13, further comprising:
identifying, based on the determined performance, one or more models from the plurality of candidate models; and
displaying, in a graphical user interface, data characterizing the determined performance of the identified one or more models.

17. The method of claim 13, wherein the plurality of candidate models is according to an initial value determined from historic performance of similar data sets.

18. The method of claim 13, wherein the value characterizing the relative proportion of model types to train characterizes a first amount of candidate models to train that have the first model type, and a second amount of candidate models to train that have the second model type.

19. The method of claim 13, further comprising:
selecting, from the candidate models and the additional candidate models, at least one final model for deployment.

20. A system comprising:
at least one data processor; and
memory storing instructions, which, when executed by the at least one data processor, cause the at least one data processor to perform operations comprising:
monitoring performance of a first generated model while the first generated model is deployed for use on live data, the monitoring including determining a first performance value of the first generated model;
monitoring performance of a second generated model while the second generated model is deployed for use on live data, the monitoring including determining a second performance value of the second generated model;
rendering, within a graphical user interface, a plot including a first axis and a second axis, the first axis including a characterization of a first performance metric and the second axis including a characterization of a second performance metric; and
rendering, within the graphical user interface and the plot, a first graphical object at a first location characterizing the first performance value and a second graphical object at a second location characterizing the second performance value;
wherein the first generated model has been trained on historical data and wherein each transaction in the live data includes an associated characteristic, wherein a distribution of transaction characteristics of the live data is different than a training distribution of transaction characteristics of the historical data.

21. The system of claim 20, the operations further comprising:
identifying, within the live data, subgroups of the live data;
determining a performance metric for the first generated model and for each of the subgroups of the live data and over time; and
rendering, within the graphical user interface, a characterization of the determined performance metric for each of the subgroups, wherein the characterization of the determined performance metric indicates a relative proportion size of a respective subgroup of the live data.

* * * * *